(12) United States Patent
Huang et al.

(10) Patent No.: US 10,917,999 B2
(45) Date of Patent: Feb. 9, 2021

(54) POWER MODULE, POWER MODULE ASSEMBLY AND ASSEMBLING METHOD THEREOF

(71) Applicant: Delta Electronics (Thailand) Public Company Limited, Samutprakarn (TH)

(72) Inventors: Zhenrong Huang, Samutprakarn (TH); Peiai You, Samutprakarn (TH); Hao Sun, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 232 days.

(21) Appl. No.: 15/952,554

(22) Filed: Apr. 13, 2018

(65) Prior Publication Data
US 2018/0343775 A1    Nov. 29, 2018

(30) Foreign Application Priority Data

May 25, 2017   (CN) .......................... 2017 1 0379283
Jan. 19, 2018   (CN) .......................... 2018 1 0054682

(51) Int. Cl.
*H05K 7/20*         (2006.01)
*H05K 5/02*         (2006.01)
(Continued)

(52) U.S. Cl.
CPC ....... *H05K 7/20927* (2013.01); *H01L 23/367* (2013.01); *H01L 23/4006* (2013.01);
(Continued)

(58) Field of Classification Search
CPC .. H05K 7/20927; H05K 1/181; H05K 5/0008; H05K 5/0204; H05K 7/20327;
(Continued)

(56) References Cited

U.S. PATENT DOCUMENTS 4,707,726 A * 11/1987 Tinder ................ H01L 23/4006
                                                    165/80.1
4,845,590 A *  7/1989 Mikolajczak ....... H01L 23/4093
                                                    361/720
(Continued)

FOREIGN PATENT DOCUMENTS

CN          101511159 A        8/2009
CN          101923991 A       12/2010
(Continued)

*Primary Examiner* — Binh B Tran
*Assistant Examiner* — Michael A Matey
(74) *Attorney, Agent, or Firm* — Kirton McConkie; Evan R. Witt

(57) ABSTRACT

The present disclosure provides a power module, a power module assembly and an assembling method thereof. The power module assembly includes a housing, a resilient bracket, a circuit board, a power device and a fastening unit. The housing includes a first heat-dissipation surface. The resilient bracket is pre-fastened on the housing. The resilient bracket is located near the first heat-dissipation surface and configured with the first heat-dissipation surface to form an accommodating space. The circuit board is configured to assemble on the housing. The power device is plugged in the circuit board and accommodated in the accommodating space. The fastening unit is pre-fastened on the housing and pressing the resilient bracket. While the resilient bracket pushes against the power device, the power device is attached to the first heat-dissipation surface.

37 Claims, 27 Drawing Sheets

(51) Int. Cl.
   *H05K 1/18* (2006.01)
   *H05K 5/00* (2006.01)
   *H01L 25/00* (2006.01)
   *H01L 25/11* (2006.01)
   *H01L 23/473* (2006.01)
   *H01L 23/40* (2006.01)
   *H01L 23/367* (2006.01)
   *H01L 25/07* (2006.01)
   *H01L 25/18* (2006.01)
   *H02M 7/00* (2006.01)

(52) U.S. Cl.
   CPC ........ *H01L 23/4093* (2013.01); *H01L 23/473* (2013.01); *H01L 25/072* (2013.01); *H01L 25/115* (2013.01); *H01L 25/18* (2013.01); *H01L 25/50* (2013.01); *H05K 1/181* (2013.01); *H05K 5/0008* (2013.01); *H05K 5/0204* (2013.01); *H05K 7/209* (2013.01); *H05K 7/2049* (2013.01); *H05K 7/20327* (2013.01); *H01L 2023/405* (2013.01); *H01L 2023/4031* (2013.01); *H01L 2023/4081* (2013.01); *H01L 2023/4087* (2013.01); *H02M 7/003* (2013.01); *H05K 2201/09063* (2013.01); *H05K 2201/1003* (2013.01); *H05K 2201/1006* (2013.01); *H05K 2201/10166* (2013.01); *H05K 2201/10393* (2013.01); *H05K 2201/10409* (2013.01); *H05K 2201/10522* (2013.01)

(58) Field of Classification Search
   CPC ................ H05K 7/2049; H05K 7/209; H05K 2201/09063; H05K 2201/1003; H05K 2201/1006; H05K 2201/10166; H05K 2201/10393; H05K 2201/10409; H05K 2201/10522; H01L 23/367; H01L 23/4006; H01L 23/4093; H01L 23/473; H01L 25/072; H01L 25/115; H01L 25/18; H01L 25/50; H01L 2023/4031; H01L 2023/405; H01L 2023/4081; H01L 2023/4087; H02M 7/003
   See application file for complete search history.

(56) References Cited

U.S. PATENT DOCUMENTS

| | | | | |
|---|---|---|---|---|
| 4,899,255 A * | 2/1990 | Case | ............... | H01L 23/4093 257/E23.086 |
| 4,922,601 A * | 5/1990 | Mikolajczak | ....... | H01L 23/4093 257/E23.086 |
| 4,972,294 A * | 11/1990 | Moses, Jr. | ........... | H01L 23/4093 165/80.3 |
| 5,225,965 A * | 7/1993 | Bailey | ................ | H01L 23/4093 165/80.3 |
| 5,274,193 A * | 12/1993 | Bailey | ................ | H01L 23/4093 165/80.3 |
| 5,309,979 A * | 5/1994 | Brauer | ................ | H01L 23/4093 165/80.2 |
| 5,321,582 A * | 6/1994 | Casperson | ........... | H05K 7/2049 257/709 |
| 5,450,284 A * | 9/1995 | Wekell | ................ | H01L 23/4006 257/719 |
| 5,731,955 A * | 3/1998 | Bartanen | ............. | H01L 23/4093 248/316.7 |
| 6,337,796 B2 * | 1/2002 | Yamada | ................ | H01L 23/433 257/707 |
| 7,778,036 B2 * | 8/2010 | Kontani | ............... | H05K 7/2049 257/718 |
| 8,797,743 B2 * | 8/2014 | Taka | ................... | H05K 7/20154 361/710 |
| 8,893,770 B2 * | 11/2014 | Gamborg | ............. | H01L 23/4093 165/80.3 |
| 9,147,634 B2 * | 9/2015 | Kodama | ............... | H01L 23/467 |
| 9,578,790 B2 * | 2/2017 | Kodama | ............... | H05K 7/20927 |
| 9,949,405 B2 * | 4/2018 | Binder | ................ | H05K 7/2049 |
| 2005/0219827 A1 * | 10/2005 | Tateyama | ............... | H05K 7/209 361/736 |
| 2006/0061969 A1 * | 3/2006 | Nilson | ................... | H05K 7/209 361/704 |
| 2006/0232942 A1 * | 10/2006 | Nakatsu | ................ | H01L 25/112 361/710 |
| 2011/0222244 A1 * | 9/2011 | Takashiro | .......... | H05K 7/20918 361/704 |
| 2013/0025823 A1 * | 1/2013 | Gamborg | ............ | H01L 23/4093 165/80.2 |
| 2013/0235527 A1 * | 9/2013 | Wagner | ................ | H05K 1/0203 361/702 |
| 2015/0146378 A1 * | 5/2015 | You | ..................... | H05K 7/20854 361/707 |
| 2015/0146380 A1 * | 5/2015 | Lu | ....................... | H05K 7/20409 361/709 |
| 2019/0166692 A1 * | 5/2019 | Kuo | ....................... | H05K 1/115 |

FOREIGN PATENT DOCUMENTS

| | | |
|---|---|---|
| CN | 202841800 U | 3/2013 |
| CN | 203242611 U | 10/2013 |
| CN | 204348685 U | 5/2015 |
| CN | 104682722 A | 6/2015 |
| CN | 104684337 A | 6/2015 |
| CN | 205454321 U | 8/2016 |
| DE | 19543260 A1 | 5/1997 |
| DE | 10317182 A1 | 11/2004 |
| EP | 2787529 A1 | 10/2014 |
| EP | 2876983 A2 | 5/2015 |
| JP | 3725225 B2 | 12/2005 |

* cited by examiner

POWER MODULE, POWER MODULE ASSEMBLY AND ASSEMBLING METHOD THEREOF

CROSS-REFERENCE TO RELATED APPLICATION

This application claims priorities to China Patent Application No. 201710379283.9, filed on May 25, 2017 and China Patent Application No. 201810054682.2, filed on Jan. 19, 2018, the entire contents of which are incorporated herein by reference for all purposes.

FIELD OF THE DISCLOSURE

The present disclosure relates to a power module, and more particularly to a power module, a power module assembly and an assembling method thereof.

BACKGROUND OF THE DISCLOSURE

An on-board power supply, also known as the power converter, is a power converting device applied to the vehicle. The power converting device uses a plurality of power devices to convert the external power into AC power or DC power. When the power converting device is in operation, the plurality of power devices can produce a large amount of heat. For avoiding the accumulated heat to influence the performance of the power converting device, it is desired to provide an effective thermal design for dissipating the heat generated from the power devices. Generally, the power devices which are through-hole devices and are soldered on a printed circuit board in a row. Then, the power devices are pressed to attach to the heat-dissipating housing, so as to ensure that the on-board power supply can be operated safely and reliably. In addition, since the power devices occupy a large area in the on-board power supply, the overall size of the on-board power supply is larger. Consequently, the power density of the on-board power supply is low.

The power devices of a conventional on-board power supply are pressed to attach to the heat-dissipating housing closely by locking the screws which directly pass through the screw holes of the power devices into the heating-dissipating housing. The conventional on-board power supply employs a lot of power devices which are intensively placed together. If the power devices are mounted on the heat-dissipating housing by locking the screws which directly pass through the screw holes of the power devices into the heating-dissipating housing, it will use up the manpower of large quantity and damage the power devices easily to result in serious malfunction of the on-board power supply. In addition, while the power devices are directly clamped to the heat-dissipating housing by the resilient steel sheet, the power density of the on-board power supply cannot be effectively raised.

The conventional on-board power module assembly is still unable to meet the requirements to increase efficiency and power density, so there is a need of providing a power module and power module assembly and an assembling method thereof to solve the problems such as heat dissipation of power devices, occupying area of power devices in the on-board power supply and installation method of the power devices.

SUMMARY OF THE DISCLOSURE

An object of the present disclosure is to provide a power module, a power module assembly and an assembling method thereof. By employing the resilient set to clamp the power devices, the assembling structure of the power devices is optimized, and the power devices are fastened easily and firmly, and the heat-dissipating capacity of the power devices is enhanced simultaneously, and the entire size of the power module assembly is reduced so that the power density of the power module assembly is enhanced.

Another object of the present disclosure is to provide a power module, a power module assembly and an assembling method thereof. By pre-fastening a fastening structure on a housing, the assembly and fastening procedures of the power module assembly are simplified and thus the purposes of saving the labor, reducing the production cost and improving the reliability of the assembly structure are achieved.

Other object of the present disclosure is to provide a power module, a power module assembly and an assembling method thereof. By pre-fastening a fastening structure on a housing, the power devices can be placed between the fastening structure and the housing and then the fastening structure is fastened on the housing firmly and presses against the power devices. Consequently, the entire size of the power module assembly is reduced, the heat-dissipating capacity of the power device is enhanced, and the overall power density is enhanced simultaneously.

In accordance with an aspect of the present disclosure, a power module assembly is provided. The power module assembly includes a housing, at least one resilient bracket, a circuit board, at least one power device and at least one fastening unit. The housing includes at least one first heat-dissipation surface and an installation surface. The resilient bracket is pre-fastened on the installation surface of the housing, located near the first heat-dissipation surface and configured with the first heat-dissipation surface to form an accommodating space. The circuit board is configured to assemble on the housing. The power device is plugged in the circuit board and accommodated in the accommodating space. The fastening unit includes an engaging part and a locking part. The locking part is disposed in the installation surface of the housing. While the engaging part is inserted and locked into the locking part, the fastening unit presses the resilient bracket and thus the resilient bracket pushes against the power device, so that the power device is attached to the first heat-dissipation surface and clamped between the resilient bracket and the first heat-dissipation surface.

In an embodiment, the resilient bracket includes a base section and a pushing section, the base section includes at least one through hole, and the pushing section is connected with the base section, wherein while the engaging part is inserted into the locking part through the through hole and the base section of the resilient bracket is pre-fastened on the installation surface of the housing, a first predetermined angle is formed between the base section and the installation surface of the housing, wherein while the engaging part is locked into the locking part to fasten and press the base section on the installation surface of the housing, the base section drives the pushing section to push against a first side of the power device, a second side of the power device is attached to the first heat-dissipation surface, and the power device is clamped between the first heat-dissipation surface and the pushing section of the resilient bracket.

In an embodiment, the housing further includes a positioning recess disposed in the installation surface of the housing and located nearby the first heat-dissipation surface and the resilient bracket further includes a positioning and supporting section extended outwardly from the base section and away from the pushing section, wherein while the engaging part is inserted into the locking part through the through hole, the base section of the resilient bracket is pre-fastened on the installation surface of the housing, a part of the positioning and supporting section is accommodated in the positioning recess, the positioning and supporting section sustains the base section, so that the first predetermined angle is formed between the base section and the installation surface of the housing, wherein while the engaging part is locked into the locking part to fasten and press the base section on the installation surface of the housing, the positioning recess and the positioning and supporting section are matched with each other to guide the base section to move close to the installation surface of the housing.

In an embodiment, the base section further includes a curl edge disposed opposite to the pushing section, wherein while the engaging part is inserted into the locking part through the through hole, the base section of the resilient bracket is pre-fastened on the installation surface of the housing, the curl edge of the base section is in contact with the installation surface of the housing, wherein while the engaging part is locked into the locking part to fasten and press the base section on the installation surface of the housing, the curl edge of the base section slides along the installation surface of the housing so that the base section is attached to the installation surface of the housing.

In an embodiment, the pushing section and the base section of the resilient bracket are connected with each other and constructed to form an L shape.

In an embodiment, the circuit board further includes at least one opening, wherein the opening is located right above the engaging part and the engaging part is locked in the locking part through the opening.

In an embodiment, the resilient bracket includes a base section, a pushing section and an interposing section, the base section is connected between the pushing section and the interposing section, and the housing further includes at least one accommodating groove disposed in the installation surface of the housing and located nearby the first heat-dissipation surface, wherein the interposing section of the resilient bracket is extended downwardly from an end of the base section having another end connected with the pushing section, wherein while the interposing section is accommodated in the accommodating groove, a second predetermined angle is formed between the base section and the installation surface of the housing, wherein while the engaging part is engaged and locked into the locking part to press and fasten the base section on the installation surface of the housing, the base section drives the pushing section to push against a first side of the power device, a second side of the power device is attached on the first heat-dissipation surface, and the power device is clamped between the first heat-dissipation surface and the pushing section of the resilient bracket.

In an embodiment, the pushing section, the base section and the interposing section of the resilient bracket are connected together and constructed to form a Z shape.

In an embodiment, the engaging part is a screw bolt and the locking part is a nut, wherein the nut is embedded in the installation surface of the housing.

In an embodiment, the housing further includes a second heat-dissipation surface, wherein while the power device is clamped between the resilient bracket and the first heat-dissipation surface, the second heat-dissipation surface and a first surface of the circuit board are attached to each other.

In an embodiment, the circuit board further includes at least one second power device and the second power device is soldered on a second surface opposite to the first surface.

In an embodiment, the housing further includes a heat-dissipation unit to exchange heat with the first heat-dissipation surface.

In an embodiment, the housing further includes a heat-dissipation unit to exchange heat with the first heat-dissipation surface and the second heat-dissipation surface.

In an embodiment, the power device is a through-hole power device.

In an embodiment, the power device is a power transistor.

In an embodiment, the power device further includes a sleeve and a main body, and the sleeve covers the main body of the power device.

In accordance with another aspect of the present disclosure, an assembling method of a power module is provided. The assembling method for the power module includes steps of: (a) providing a housing and at least one resilient bracket, wherein the housing includes at least one first heat-dissipation surface and an installation surface, and the resilient bracket is pre-fastened on the installation surface of the housing, located nearby the first heat-dissipation surface and configured with the first heat-dissipation surface to form an accommodating space; (b) providing a circuit board and at least one power device, wherein the power device is plugged in the circuit board; (c) assembling the circuit board on the housing and accommodating the power device in the accommodating space; and (d) providing at least one fastening unit including an engaging part and a locking part, wherein the locking part is disposed in the installation surface of the housing, wherein while the engaging part is inserted and locked into the locking part, the fastening unit presses the resilient bracket and the resilient bracket pushes against the power device, so that the power device is attached to the first heat-dissipation surface and clamped between the resilient bracket and the first heat-dissipation surface.

In an embodiment, the resilient bracket includes a base section and a pushing section, the base section includes at least one through hole, the pushing section and the base section are connected with each other, and the pushing section is located near the first heat-dissipation surface, wherein the step (a) further includes a step (a1) inserting the engaging part into the locking part through the through hole to pre-fasten the resilient bracket on the installation surface of the housing, wherein a first predetermined angle is formed between the base section and the installation surface of the housing.

In an embodiment, the step (d) further includes a step (d1) locking the engaging part into the locking part to press and fasten the base section on the installation surface of the housing, so that the base section drives the pushing section to push against a first side of the power device, a second side of the power device is attached to the first heat-dissipation surface, and the power device is clamped between the first heat-dissipation surface and the pushing section of the resilient bracket.

In an embodiment, the circuit board further includes at least one opening, and the opening is set right above the engaging part, wherein at the step (d1), the engaging part is locked into the locking part through the opening.

In an embodiment, the housing further includes a positioning recess disposed in the installation surface of the housing and located nearby the first heat-dissipation surface and the resilient bracket further includes a positioning and supporting section extended outwardly from the base section and away from the pushing section, wherein the step (a1) further includes a step (a0) placing a part of the positioning and supporting section in the positioning recess so that the positioning and supporting section sustains the base section.

In an embodiment, the base section further includes a curl edge disposed opposite to the pushing section, wherein the step (d) further includes a step (d1) inserting the engaging part into the locking part through the through hole to pre-fasten the base section of the resilient bracket on the installation surface of the housing and allow the curl edge of the base section to be in contact with the installation surface of the housing, and a step (d2) locking the engaging part into the locking part to fasten and press the base section on the installation surface of the housing, wherein the curl edge of the base section slides along the installation surface of the housing, the base section is attached to the installation surface of the housing.

In an embodiment, the resilient bracket includes a base section, a pushing section and an interposing section, the base section is connected between the pushing section and the interposing section, and the housing further includes at least one accommodating groove disposed in the installation surface of the housing and located nearby the first heat-dissipation surface, wherein the interposing section of the resilient bracket is extended downwardly from an end of the base section having another end connected with the pushing section, wherein the step (a) further includes a step (a2) placing the interposing section into the accommodating groove of the housing, wherein a second predetermined angle is formed between the base section and the installation surface of the housing.

In an embodiment, the step (d) further includes a step (d2) engaging and locking the engaging part into the locking part to press and fasten the base section on the installation surface of the housing, wherein the base section drives the pushing section to push against a first side of the power device, a second side of the power device is attached on the first heat-dissipation surface, and the power device is clamped between the first heat-dissipation surface and the pushing section of the resilient bracket.

In accordance with other aspect of the present disclosure, a power module is provided. The power module includes a hosing, at least one resilient bracket, a circuit board, at least one magnetic component, at least one power device and at least one fastening unit. The housing includes a base and a three-dimensional structure. The base includes at least one installation surface, and the three-dimensional structure which is disposed on the base includes a first recess and four lateral walls. At least one of the laterals walls includes an outer surface configured as a first heat-dissipation surface and the corresponding lateral wall of the first heat-dissipation surface includes a bottom connected with the installation surface. The at least one resilient bracket is pre-fastened on the installation surface, located near the first heat-dissipation surface and configured with the first heat-dissipation surface to form an accommodating space. The circuit board configured to assemble on the housing. The at least one magnetic component is accommodated in the first recess and electrically connected to the circuit board. The at least one power device is plugged in the circuit board and accommodated in the accommodation space. The at least one fastening unit includes an engaging part and a locking part. The locking part is disposed in the installation surface. While the engaging part is inserted and locked into the locking part, the fastening unit presses the resilient bracket and the resilient bracket pushes against the power device, so that the power device is attached to the first heat-dissipation surface and clamped between the resilient bracket and the first heat-dissipation surface.

In an embodiment, the three-dimensional structure further includes a second heat-dissipation surface, wherein while the power device is clamped between the resilient bracket and the first heat-dissipation surface, the second heat-dissipation surface and a first surface of the circuit board are attached to each other.

In an embodiment, the circuit board further includes at least one second power device, and the second power device is soldered on a second surface opposite to the first surface.

In an embodiment, the second heat-dissipation surface is a top surface of one of the lateral walls.

In an embodiment, the power module further includes an electromagnetic filter unit, wherein the housing further includes a second recess, and the electromagnetic filter unit is accommodated in the second recess and electrically connected to the circuit board.

In an embodiment, the magnetic component includes a transformer accommodated in the first recess and electrically connected to the circuit board.

In an embodiment, the power device and the second power device are a secondary power device and a primary power device, respectively.

In an embodiment, the housing further includes a heat-dissipation unit including a liquid-cooling chamber and a fluid channel, the heat-dissipation unit is thermal coupled with the three-dimensional structure.

In an embodiment, the power device and the second power device are power transistors.

In an embodiment, the resilient bracket includes a base section and a pushing section, the base section includes at least one through hole, and the pushing section is connected with the base section, wherein while the engaging part is inserted into the locking part through the through hole and the base section of the resilient bracket is pre-fastened on the installation surface, a first predetermined angle is formed between the base section and the installation surface, wherein while the engaging part is locked into the locking part to fasten and press the base section on the installation surface, the base section drives the pushing section to push against a first side of the power device, a second side of the power device is attached to the first heat-dissipation surface, and the power device is clamped between the first heat-dissipation surface and the pushing section of the resilient bracket.

In an embodiment, the housing further includes a positioning recess disposed in the installation surface and located nearby the first heat-dissipation surface, and the resilient bracket further includes a positioning and supporting section extended outwardly from the base section and away from the pushing section, wherein the positioning and supporting section is partially received in the positioning recess, while the engaging part is inserted into the locking part through the through hole, the base section of the resilient bracket is pre-fastened on the installation surface, a part of the positioning and supporting section is accommodated in the positioning recess, the positioning and supporting section sustains the base section, and the first predetermined angle is formed between the base section and the installation surface, wherein while the engaging part is locked into the locking part to fasten and press the base section on the installation surface, the positioning recess and the positioning and supporting section are matched with each other to guide the base section to move close to the installation surface.

In an embodiment, the base section further includes a curl edge disposed opposite to the pushing section, wherein while the engaging part is inserted into the locking part through the through hole, the base section of the resilient bracket is pre-fastened on the installation surface, the curl edge of the base section is in contact with the installation surface, wherein while the engaging part is engaged and locked into the locking part to fasten and press the base section on the installation surface, the curl edge of the base section slides along the installation surface so that the base section is attached to the installation surface.

In an embodiment, the pushing section and the base section of the resilient bracket are connected with each other and constructed to form an L shape.

In an embodiment, the circuit board further includes at least one opening, wherein the opening is set right above the engaging part and the engaging part is locked into the locking part through the opening.

In an embodiment, the resilient bracket includes a base section, a pushing section and an interposing section, the base section is connected between the pushing section and the interposing section, and the base further includes at least one accommodating groove disposed in the installation surface and located nearby the first heat-dissipation surface, wherein the interposing section of the resilient bracket is extended downwardly from an end of the base section having another end connected with the pushing section, wherein while the interposing section is accommodated in the accommodating groove, a second predetermined angle is formed between the base section and the installation surface, wherein while the engaging part is engaged and locked into the locking part to press and fasten the base section on the installation surface, the base section drives the pushing section to push against a first side of the power device, a second side of the power device is attached on the first heat-dissipation surface, so that the power device is clamped between the first heat-dissipation surface and the pushing section of the resilient bracket.

In an embodiment, the pushing section, the base section and the interposing section of the resilient bracket are connected together and constructed to form a Z shape.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
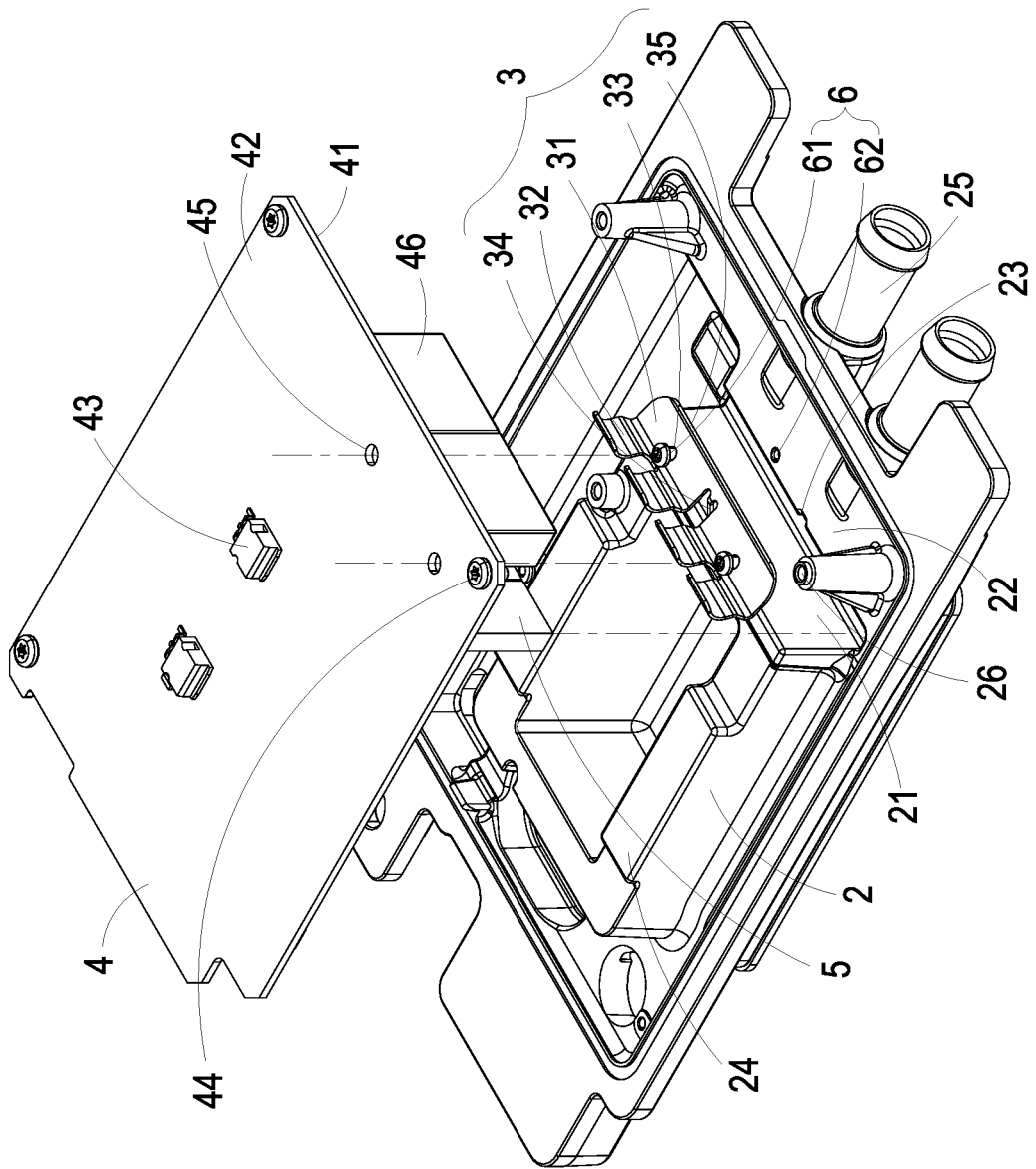
FIG. 1 is an exploded view illustrating the power module assembly according to a first embodiment of the present disclosure.
Figure 2:
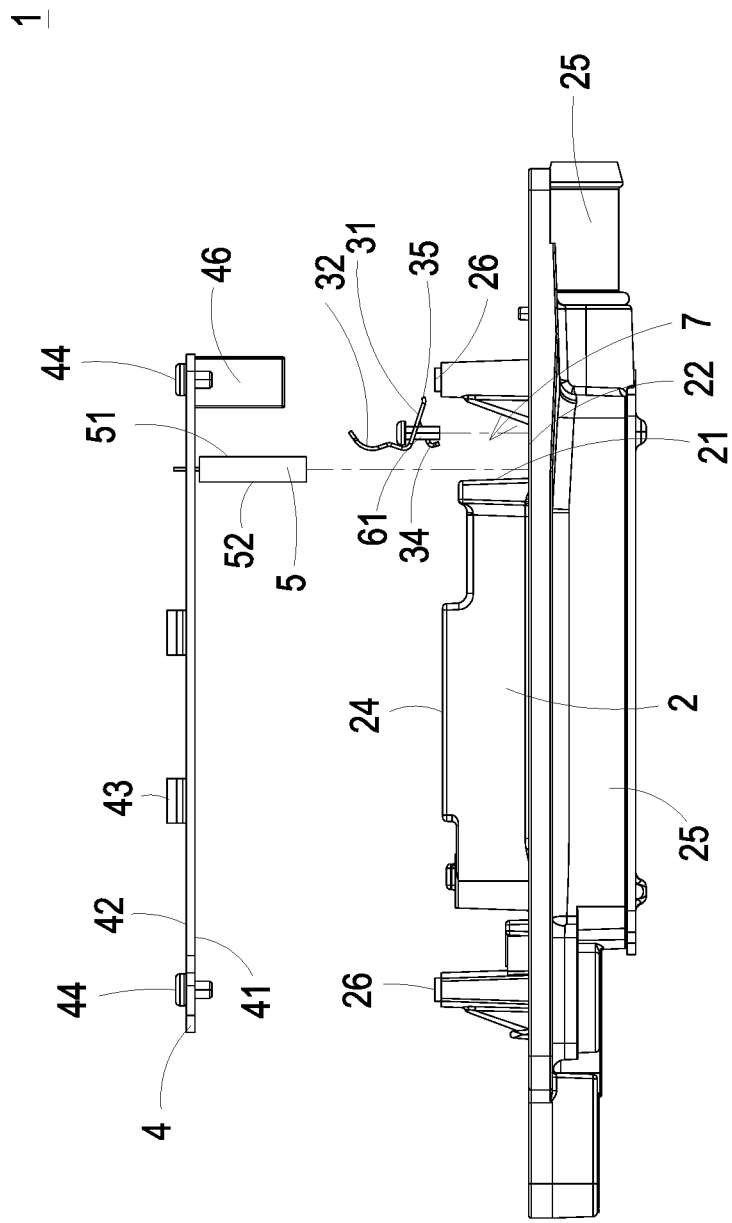
FIG. 2 is a lateral view of FIG. 1.

FIG. 1 is an exploded view illustrating the power module assembly according to a first embodiment of the present disclosure, and FIG. 2 is a lateral view of FIG. 1. Firstly, as shown in FIGS. 1 and 2, the power module assembly 1 includes a housing 2, at least one resilient bracket 3, a circuit board 4, at least one power device 5 and at least one fastening unit 6. The housing 2 includes at least one first heat-dissipation surface 21 and an installation surface 22. The circuit board 4 is configured to assemble on the housing 2. The power device 5 is plugged in the circuit board 4. Preferably, the power device 5 is soldered on the first surface 41 of the circuit board 4 by for example but not limited to a soldering method. The power device 5 can be for example but not limited to a power transistor. The fastening unit 6 includes an engaging part 61 and a locking part 62. The locking part 62 is disposed in the installation surface 22 of the housing 2. In the embodiment, the resilient bracket 3 includes a base section 31 and a pushing section 32. The base section 31 includes at least one through hole 33, and the pushing section 32 is connected with the base section 31. A specific angle is formed between the pushing section 32 and the base section 31. In the embodiment, the pushing section 32 and the base section 31 of the resilient bracket 3 are connected with each other and constructed to form an L shape. Namely, the specific angle formed between the base section 31 and the pushing section 32 is approximately 90 degrees, but it is not limited. It is noted that the resilient bracket 3 is not limited to the above-mentioned embodiment. Any resilient bracket 3 including the base section 31 and the pushing section 32 connected at the specific angle and having elastic force can be employed in the power module assembly 1 of the present disclosure.

Figure 3:
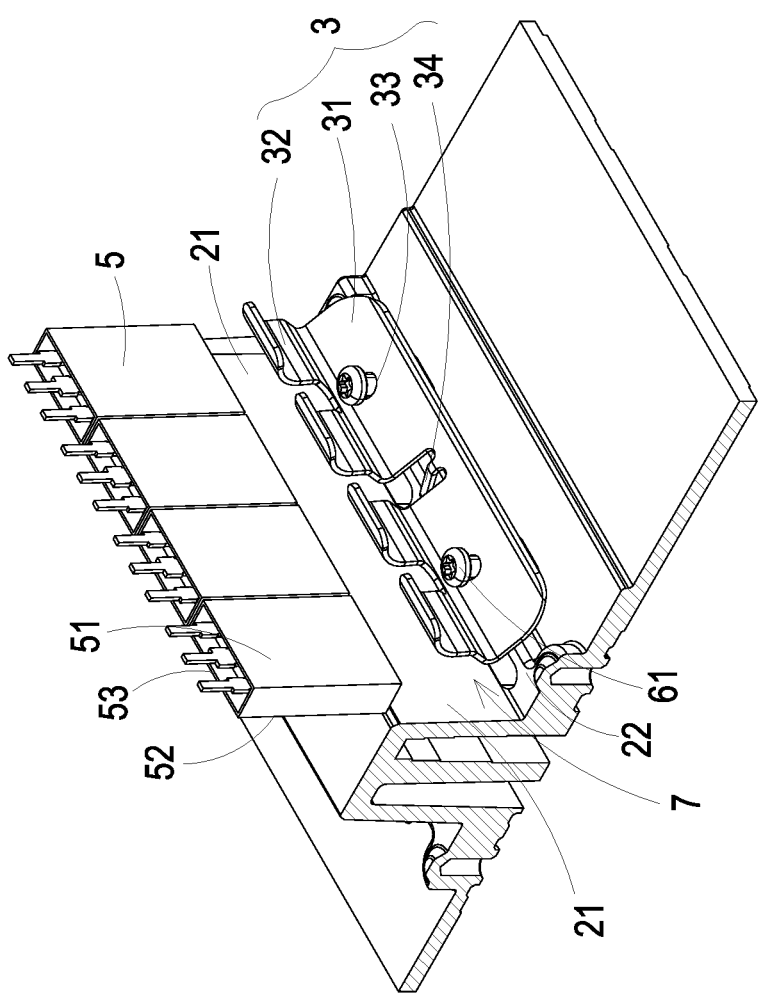
FIG. 3 is a schematic view illustrating the resilient bracket pre-fastened on the housing according to the first embodiment of the present disclosure.
Figure 4:
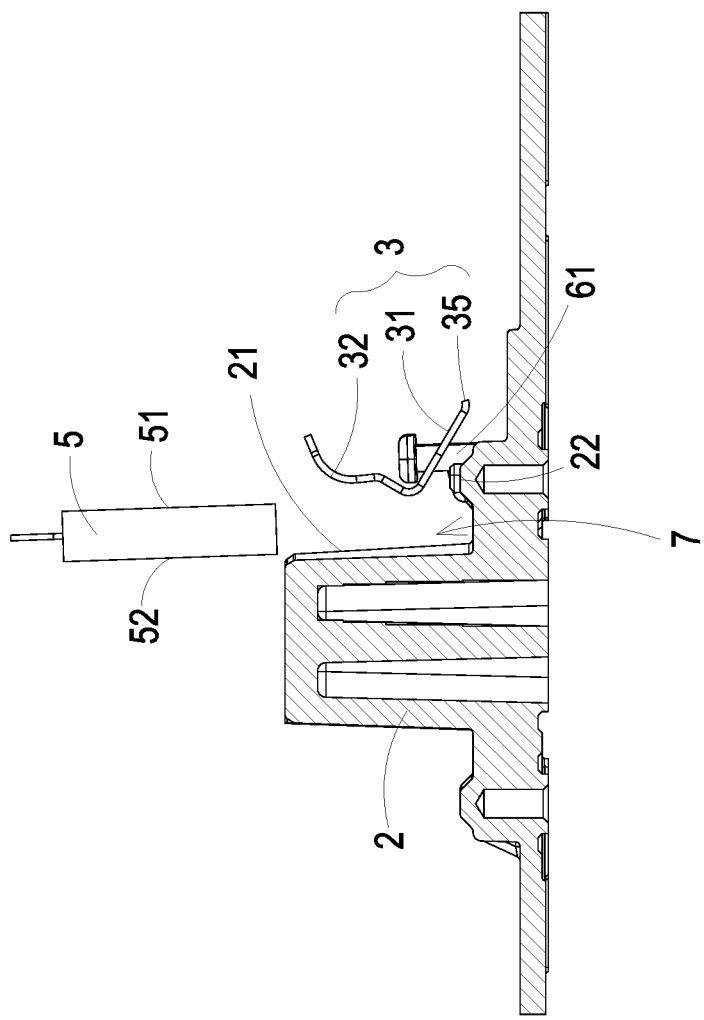
FIG. 4 is a lateral view of FIG. 3.
Figure 5:
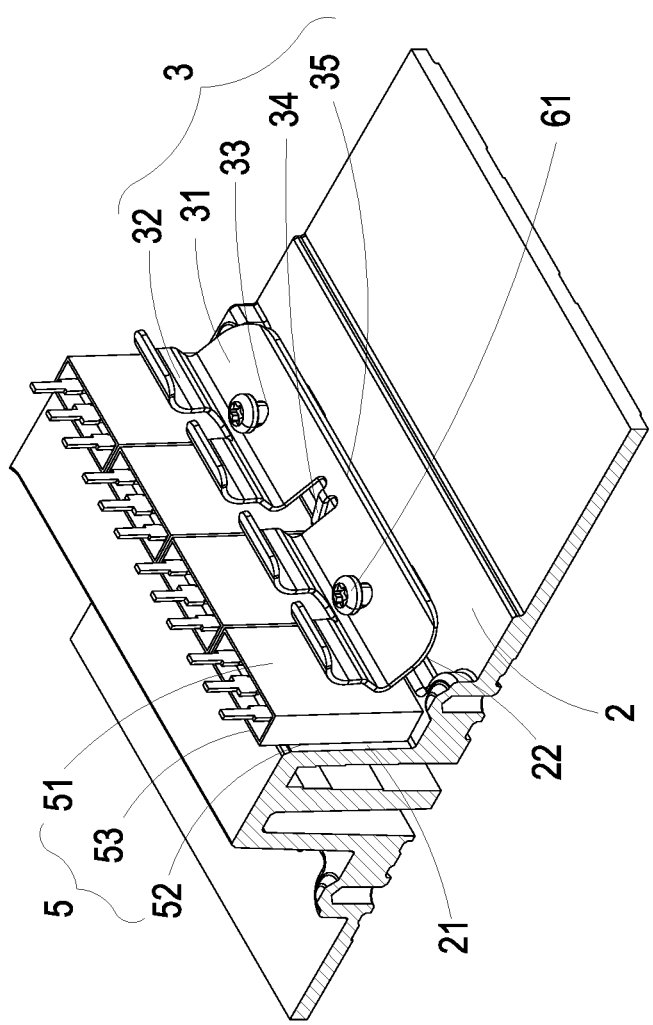
FIG. 5 is a schematic view illustrating the power device accommodated in the accommodating space according to the first embodiment of the present disclosure.
Figure 6:
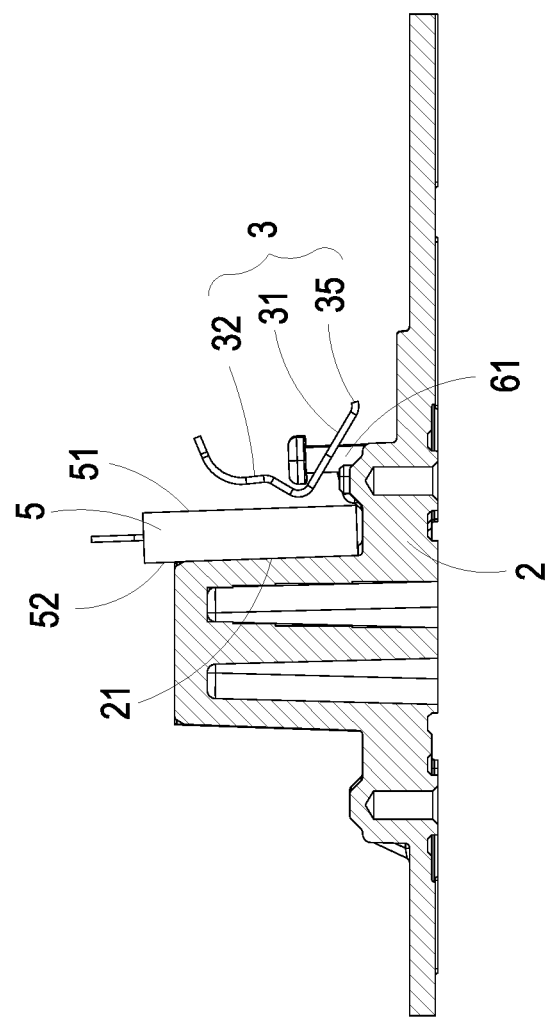
FIG. 6 is a lateral view of FIG. 5.
Figure 7:
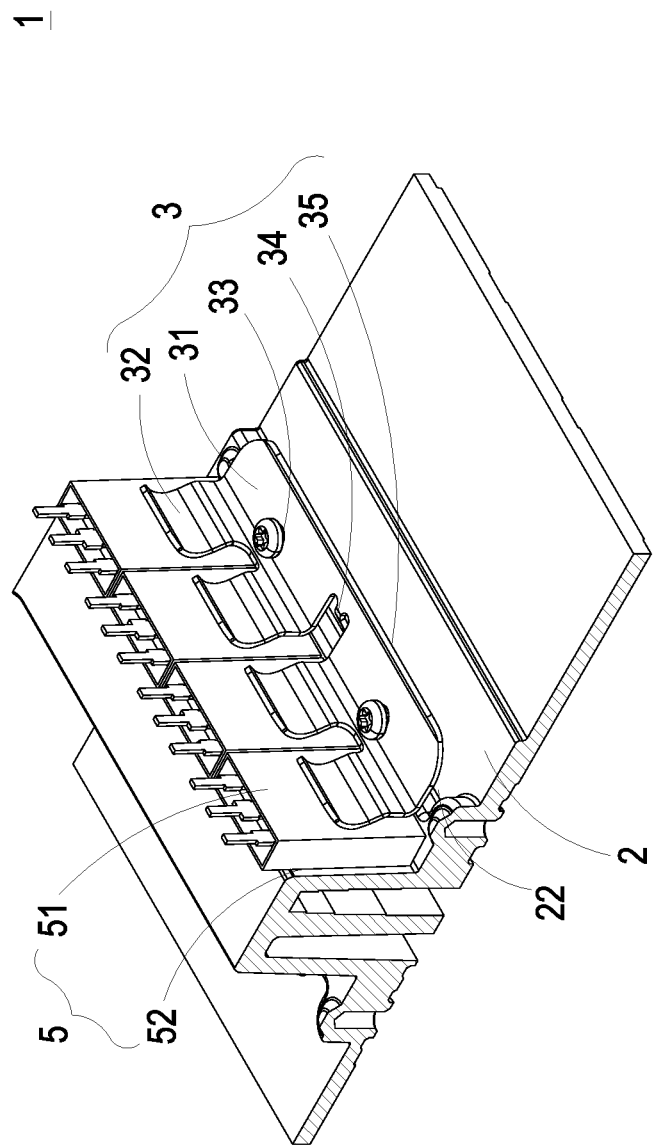
FIG. 7 is a schematic view illustrating the power device clamped by the resilient bracket according to the first embodiment of the present disclosure.
Figure 8:
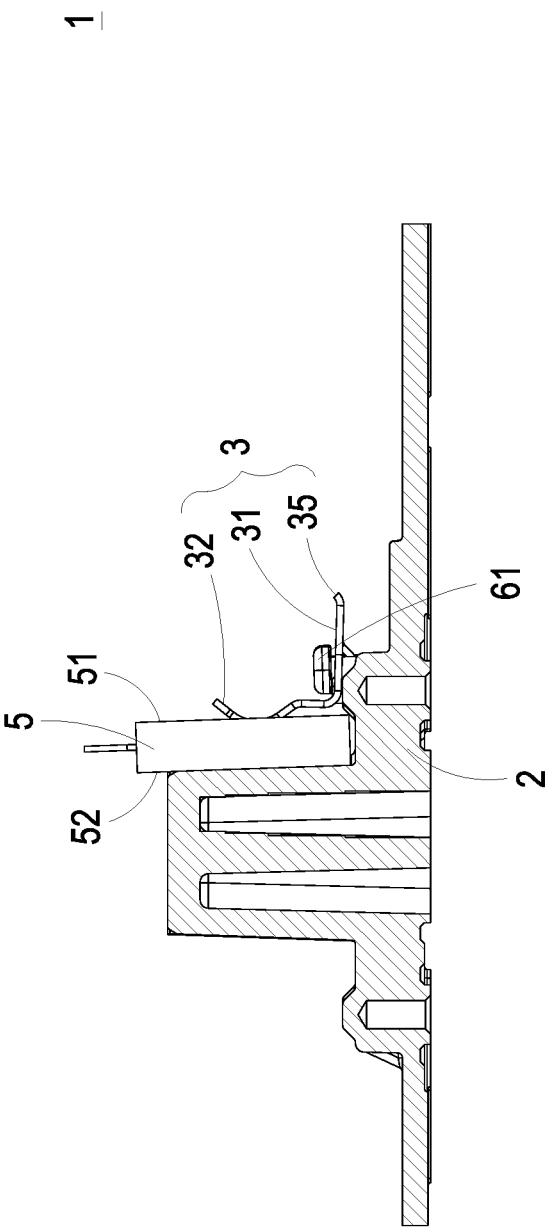
FIG. 8 is a lateral view of FIG. 7.

FIG. 3 is a schematic view illustrating the resilient bracket pre-fastened on the housing according to the first embodiment of the present disclosure, and FIG. 4 is a lateral view of FIG. 3. As shown in FIGS. 3 and 4, the resilient bracket 3 is pre-fastened on the installation surface 22 of the housing 2, located near the first heat-dissipation surface 21. The resilient bracket 3 and the first heat-dissipation surface 21 are configured to form an accommodating space 7. In the embodiment, the engaging part 61 of the fastening unit 6 is inserted into the locking part 62 through the through hole 33 to pre-fasten the base section 31 of the resilient bracket 3 on the installation surface 22 of the housing 2. The base section 31 of the resilient bracket 3 and the installation surface 22 of the housing 22 form a first predetermined angle and the elastic force of the resilient bracket 3 is maintained. FIG. 5 is a schematic view illustrating the power device accommodated in the accommodating space according to the first embodiment of the present disclosure, and FIG. 6 is a lateral view of FIG. 5. As shown in FIGS. 5 and 6, the power device 5 is accommodated in the accommodating space 7. FIG. 7 is a schematic view illustrating the power device clamped by the resilient bracket according to the first embodiment of the present disclosure, and FIG. 8 is a lateral view of FIG. 7. As shown in FIGS. 7 and 8, the resilient bracket 3 pre-fastened on the installation surface 22 of the housing 2 can be further adjusted. Namely, the engaging part 61 is locked into the locking part 62, and the engaging part 61 presses the base section 31 of the resilient bracket 3, so as to fasten the base section 31 on the installation surface 22 of the housing 2. Consequently, the base section 31 drives the pushing section 32 to push against a first side 51 of the power device 5, a second side 51 of the power device 5 and the first heat-dissipation surface 21 are attached to each other so that the power device 5 is clamped between the first heat-dissipation surface 21 of the housing 2 and the pushing section 32 of the resilient bracket 3. Accordingly, fastened structure of the power device 5 can reduce its occupied space in the power module assembly 1, so that the size of the entire power module assembly 1 is reduced and the power density of the entire power module assembly 1 is increased. Besides, the power device 5 is directly fastened on the first heat-dissipation surface 21 to provide not only the better fastened effects but also better heat-dissipation effects.

Figure 9:
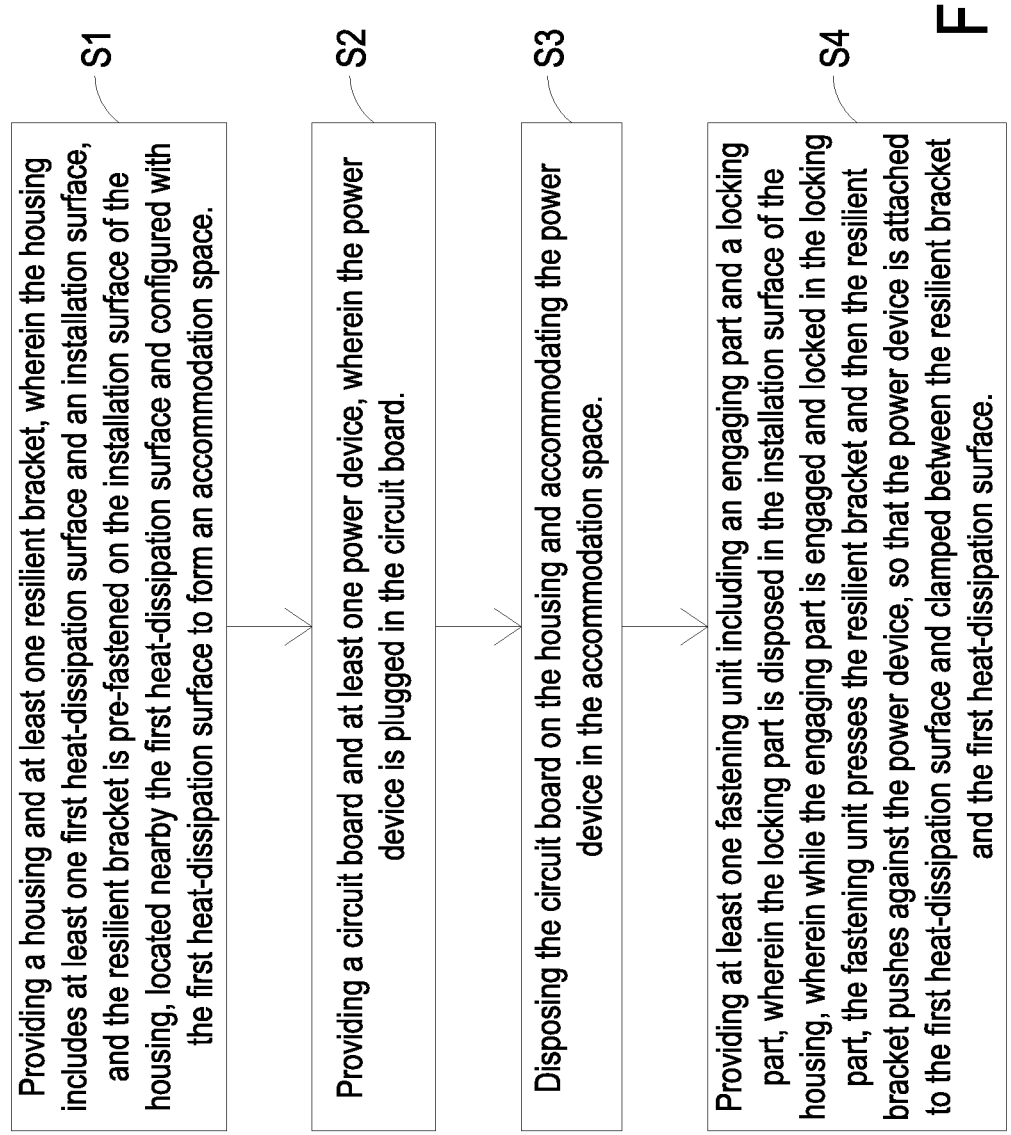
FIG. 9 is a flow chart of an assembling method for a power module assembly according to a preferred embodiment of the present disclosure.

According to the power module assembly 1, the present disclosure also provides an assembling method of the power module assembly. FIG. 9 is a flow chart of an assembling method for a power module assembly according to a preferred embodiment of the present disclosure. As shown in FIGS. 1 to 9, the assembling method is described as following. Firstly, a housing 2 and at least one resilient bracket 3 are provided as shown at the step S1 of FIG. 9. The housing 2 includes at least one first heat-dissipation surface 21 and an installation surface 22. The resilient bracket 3 is pre-fastened on the installation surface 22 of the housing 2, located nearby the first heat-dissipation surface 21. The resilient bracket 3 and the first heat-dissipation surface 21 are configured to form an accommodating space 7 (see FIGS. 3 and 4). The base section 31 of the resilient bracket 3 and the installation surface 22 of the housing 2 form a first predetermined angle. On the other hand, a circuit board 4 and at least one power device 5 are provided for the power module assembly 1 as shown at the step S2 of FIG. 9. The power device 5 is plugged in the circuit board 4 (see FIGS. 1 and 2). Then, as shown at the step S3 of FIG. 9, the circuit board 4 is assembled on the housing 2 and the power device 5 is accommodated in the accommodating space 7 (see FIGS. 5 and 6). Finally, as shown at the step S4 of FIG. 9, the fastening unit 6 includes an engaging part 61 and a locking part 62, wherein the locking part 62 is disposed in the installation surface 22 of the housing 2. While the engaging part 61 is locked into the locking part 62, the fastening unit 6 presses the resilient bracket 3 and then the resilient bracket 3 pushes against the power device 5, the power device 5 is attached to the first heat-dissipation surface 21, so that the power device 5 is clamped between the resilient bracket 3 and the first heat-dissipation surface 21. In the embodiment, while the fastening unit 6 pre-fastened on the housing 2 is adjusted, namely while the engaging part 61 is inserted and locked into the locking part 62, the engaging part 61 fastens and presses the base section 31 on the installation surface 22 of the housing 2 through the through hole 33. Consequently, the base section 31 drives the pushing section 32 to push against a first side 51 of the power device 5, a second side 52 of the power device 5 is attached to the first heat-dissipation surface 21 of the housing 2, so that the power device 5 is clamped between the first heat-dissipation surface 21 of the housing 2 and the pushing section 32 of the resilient bracket 3.

Figure 10:
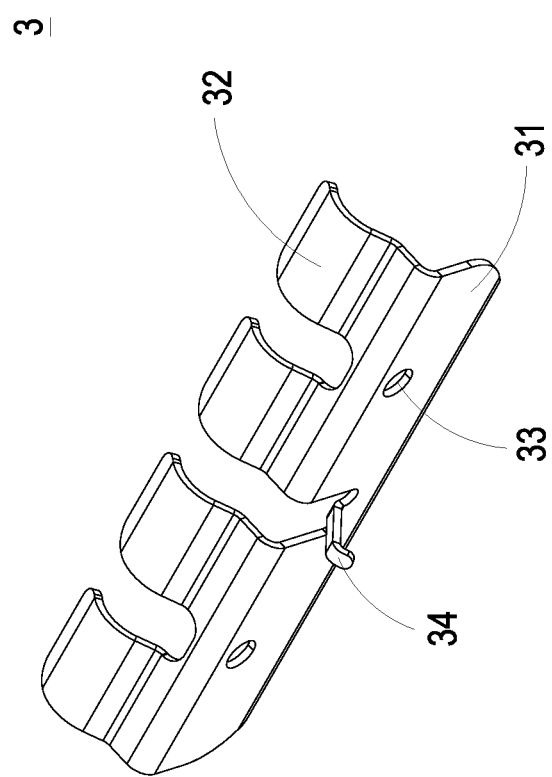
FIG. 10 shows an exemplary resilient bracket according to the first embodiment of the present disclosure.

In particular, the engaging part 61 can be for example but not limited to a screw bolt and the locking part 62 can be for example but not limited to a nut. For example, the nut is embedded into the installation surface 22. The locking part 62 is embedded into the installation surface 22 of the housing 2 and the engaging part 61 is inserted into the locking part 62 in advance. Consequently, the engaging part 61 pre-fastens the resilient bracket 3 on the installation surface 22 of the housing 2 through the through hole 33, so that the base section 31 of the resilient bracket 3 and the installation surface 22 of the housing 2 form the first predetermined angle. FIG. 10 shows an exemplary resilient bracket according to the first embodiment of the present disclosure. As shown in FIGS. 1 to 8 and 10, in the embodiment, the housing 2 further includes a positioning recess 23. The positioning recess 23 is disposed in the installation surface 22 of the housing 2 and located nearby the first heat-dissipation surface 21. The resilient bracket 3 further includes a positioning and supporting section 34 extended outwardly from the base section 31 and away from the pushing section 32. The front end of the positioning and supporting section 34 is accommodated in the positioning recess 23 of the housing 2, and the positioning and supporting section 34 sustains the base section 31 for providing the positioning function. While the engaging part 61 passes the through hole 33 and is inserted into the locking part 62, the base section 31 of the resilient bracket 3 is pre-fastened on the installation surface 22 of the housing 2, the front end of the positioning and supporting section 34 is accommodated in the positioning recess 23, the positioning and supporting section 34 sustains the base section 31, so that the first predetermined angle is formed between the base section 31 and the installation surface 22 of the housing 2 (see FIGS. 3 and 4). Consequently, if the power device 5 is accommodated in the accommodating space 7, the power device 5 won't be pushed by the pushing section 32 of the resilient bracket 3. On the other hand, while the engaging part 61 is inserted into the locking part 62 through the through hole 33 to fasten and press the base section 31 on the installation surface 22 of the housing 2, the positioning recess 23 and the positioning and supporting section 34 are matched with each other to guide the base section 31 to move close to the installation surface 22 of the housing 2. Consequently, the positioning and supporting section 34 is deformed. It is noted that the positioning and supporting section 34 is maintained to joint with the base section 31 and the front end of the positioning and supporting section 34 is still accommodated in the positioning recess 23. The pushing section 32 of the resilient bracket 3 pushes against the first side 51 of the power device 5, the second side 52 of the power device 5 is attached to the first heat-dissipation surface 21 of the housing 2, so that the power device 5 is clamped between the first heat-dissipation surface 21 and the pushing section 32. In another embodiment, the base section 31 further includes a curl edge 35 disposed opposite to the pushing section 32. While the engaging part 61 passes the through hole 33 and is inserted into the locking part 62, and the base section 31 of the resilient bracket 3 is pre-fastened on the installation surface 22 of the housing 2, so that the curl edge 35 of the base section 31 is in contact with the installation surface 22 of the housing 2. While the engaging part 61 is locked into the locking part 62 to fasten and press the base section 31 on the installation surface 22 of the housing 2, the curl edge 35 of the base section 31 slides along the installation surface 22 of the housing 2, so that the base section 31 is attached to the installation surface 22 of the housing 2. While the engaging part 61 is locked into the locking part 62, the curl edge 35 of the base section 31 slides away from the first heat-dissipation surface 21, so that the base section 31 is not stuck during the sliding process and the base section 31 is prevented from scratching the installation surface 22 of the housing 2 during the sliding process, wherein the sliding process means that the curl edge 35 of the base section 31 slides along the installation surface 22 of the housing 2.

Figure 11:
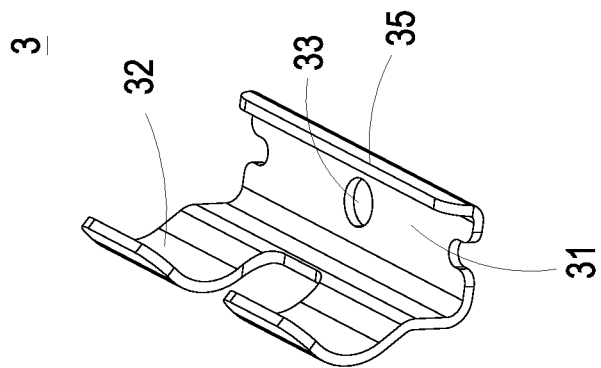
FIG. 11 shows another exemplary resilient bracket according to the first embodiment of the present disclosure.

Please refer to FIGS. 1 and 2. In the embodiment, the housing 2 further includes a second heat-dissipation surface 24. While the power device 5 is clamped between the resilient bracket 3 and the housing 2, the second heat-dissipation surface 24 and a first surface 41 of the circuit board 4 are attached to each other. The circuit board 4 further includes at least one second power device 43 and the second power device 43 is soldered on a second surface 42 opposite to the first surface 41 and opposite to the second heat-dissipation surface 24 of the housing 2. The second power device 43 can be for example but not limited to a power transistor. In the embodiment, the second power device 43 can be for example but not limited to a Surface-mount technology power device (i.e. SMT power device). In practical, the housing 2 further includes a heat-dissipation unit 25 to exchange heat with the first heat-dissipation surface 21 and exchange heat with the second heat-dissipation surface 24. While the power device 5 is attached to the first heat-dissipation surface 21 and the SMT power device 43 is attached to the second heat-dissipation surface 24 by soldering the SMT power device 43 on the circuit board 4, the heat-dissipation function is provided by the heat-dissipation unit 25 to effectively dissipate heat generated by the power device 5 and the SMT power device 43. In the embodiment, the power device 5 can be for example but not limited to TO247 through-hole power transistor. It is emphasized that the first heat-dissipation surface 21 and the second heat-dissipation surface 24 of the housing 2 are adjustable according to the disposed positions and the numbers of the power device 5 and the SMT power device 43 of the circuit board 4. In an embodiment, the power device 5 further includes a sleeve 53 covering the main body of the power device 5. While the pushing section 32 of the resilient bracket 3 pushes against the power device 5, the sleeve 53 is pressed and deformed to protect the power device 5. In other embodiments, the circuit board 4 is assembled on the housing 2 after the fixing elements 44 is locked in the fixing hole 26. Namely, the circuit board 4 is assembled on the housing 2. In the embodiment, it is noted that the circuit board 4 further includes at least one opening 45. The opening 45 is set right above the engaging part 61. While the circuit board 4 is assembled on the housing 2 and the power device 5 is accommodated in the accommodating space 7, the engaging part 61 is locked into the locking part 62 through the opening 45, so that the power device 5 is clamped between the resilient bracket 3 and the first heat-dissipation surface 21. Even though there are several other electronic components 46 disposed on the circuit board 4, the electronic components 46 might cover the resilient bracket 3 while the circuit board 4 is assembled on the housing 2. The engaging part 61 is still capable of being adjusted through the opening 45. Consequently, the resilient bracket 3 pushes against the power device 5 and the power device 5 is clamped between the first heat-dissipation surface 21 of the housing 2 and the resilient bracket 3. In another embodiment, the engaging part 61 can be unlocked and taken away from the locking part 62 by adjusting the engaging part 61 through the opening 45, so as to facilitate the circuit board 4 to be removed from the housing 2. Consequently, the power module assembly is more flexible and convenient for installation and disassembly. On the other hand, in the embodiment, each resilient bracket 3 includes a plurality of pushing sections 32 configured to push against a plurality of power devices 5, respectively. As shown in FIGS. 1 to 8 and 10, a single resilient bracket 3 is utilized to clamp four power devices 5 arranged in a row. Certainly, in other embodiments, the numbers of the resilient bracket 3 and the power device 5 are adjustable according to the practical requirements. FIG. 11 shows another exemplary resilient bracket according to the first embodiment of the present disclosure. Each single resilient bracket 3 is utilized to clamp two power devices 5 arranged in a row, and the position distribution of the power device 5 is more flexible. Certainly, the numbers of the resilient bracket 3 and the power device 5 are not limited, and are not redundantly described herein.

Figure 12:
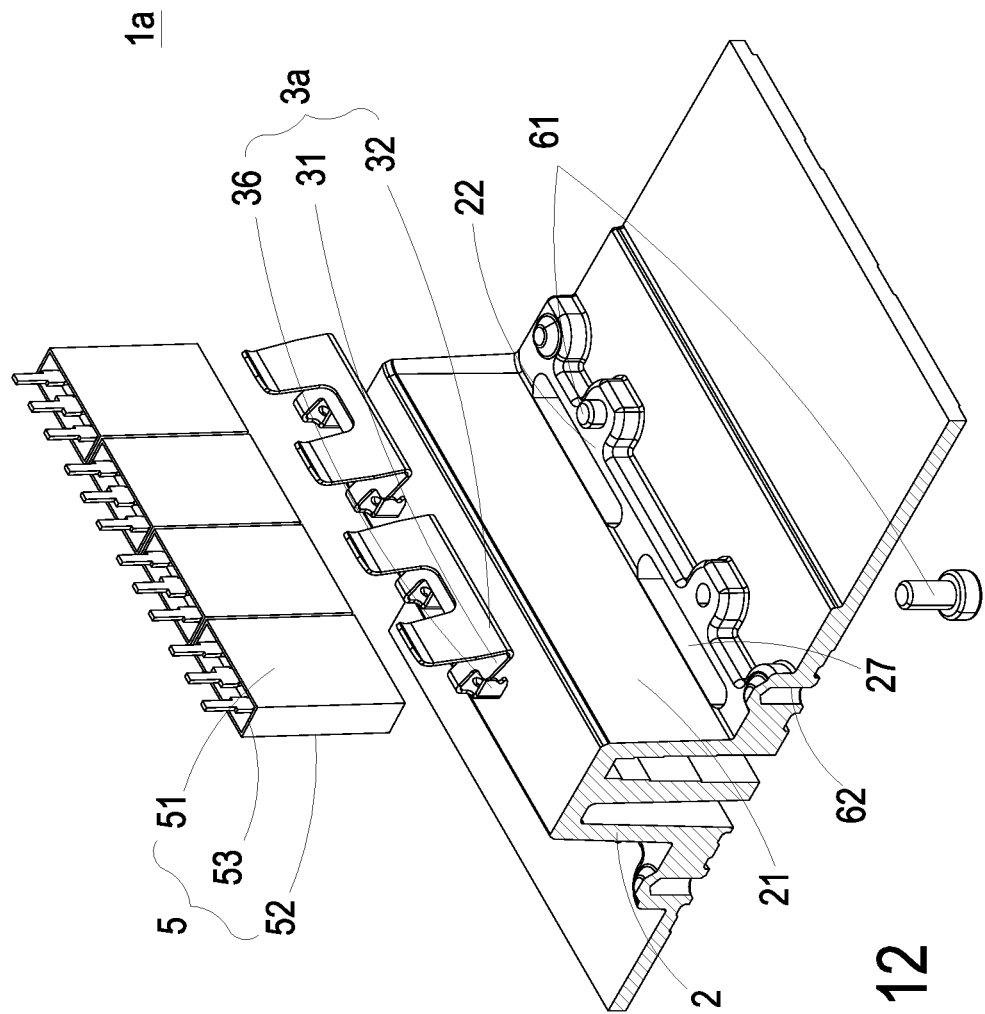
FIG. 12 is an exploded view illustrating a part of the power module assembly according to a second embodiment of the present disclosure.
Figure 13:
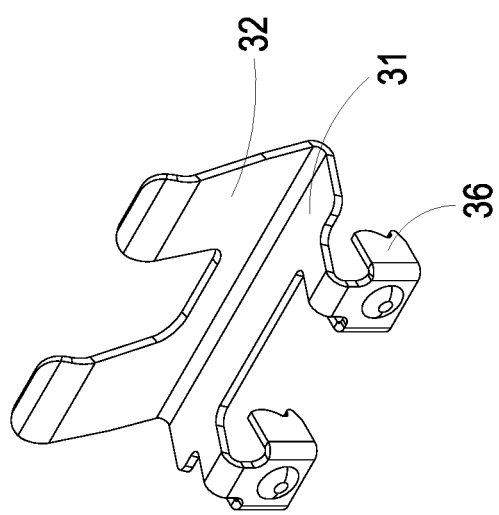
FIG. 13 is a schematic view illustrating the resilient bracket according to the second embodiment of the present disclosure.

FIGS. 12 to 18 show a power module assembly according to a second embodiment of the present disclosure. In the embodiment, the structures, elements and functions of the power module assembly 1a are similar to those of the power module assembly 1 in FIGS. 1 to 8, and are not redundantly described herein. Different from the power module assembly 1 of FIGS. 1 to 8, in the embodiment, the housing 2 further includes at least one accommodating groove 27. The accommodating groove 27 is disposed in the installation surface 22 of the housing 2 and located nearby the first heat-dissipation surface 21. FIG. 13 is a schematic view illustrating the resilient bracket according to the second embodiment of the present disclosure. Different from the resilient bracket 3 of FIGS. 1 to 8, in the embodiment, the resilient bracket 3a includes a base section 31, a pushing section 32 and an interposing section 36. The base section 31 is connected between the pushing section 32 and the interposing section 36. In practical, the pushing section 31, the base section 32 and the interposing section 36 are connected together and constructed to form a Z shape. Moreover, the base section 31 and the pushing section 31 are approximately at an acute angle so that the elastic force of the resilient bracket 3a is maintained. It is noted that the resilient bracket 3a is not limited to the above-mentioned embodiment. Any resilient bracket 3a including the base section 31 and the pushing section 32 constructed to form a specific angle and having elastic force can be employed in the power module assembly 1a of the present disclosure.

Figure 14:
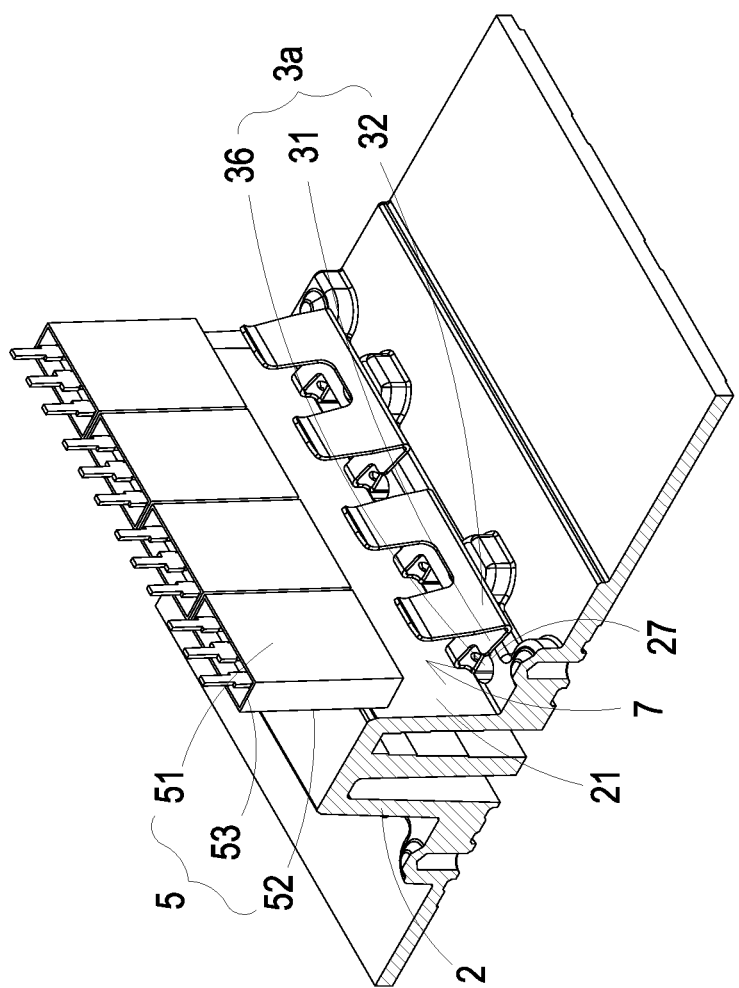
FIG. 14 is a schematic view illustrating the resilient bracket pre-fastened on the housing according to the second embodiment of the present disclosure.
Figure 15:
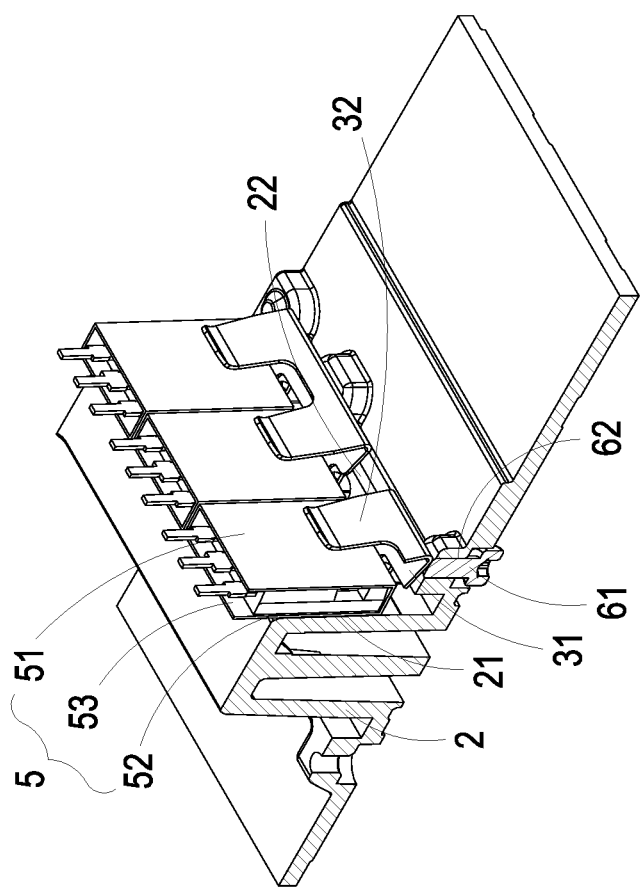
FIG. 15 is a schematic view illustrating the power device accommodated in the accommodating space according to the second embodiment of the present disclosure.
Figure 16:
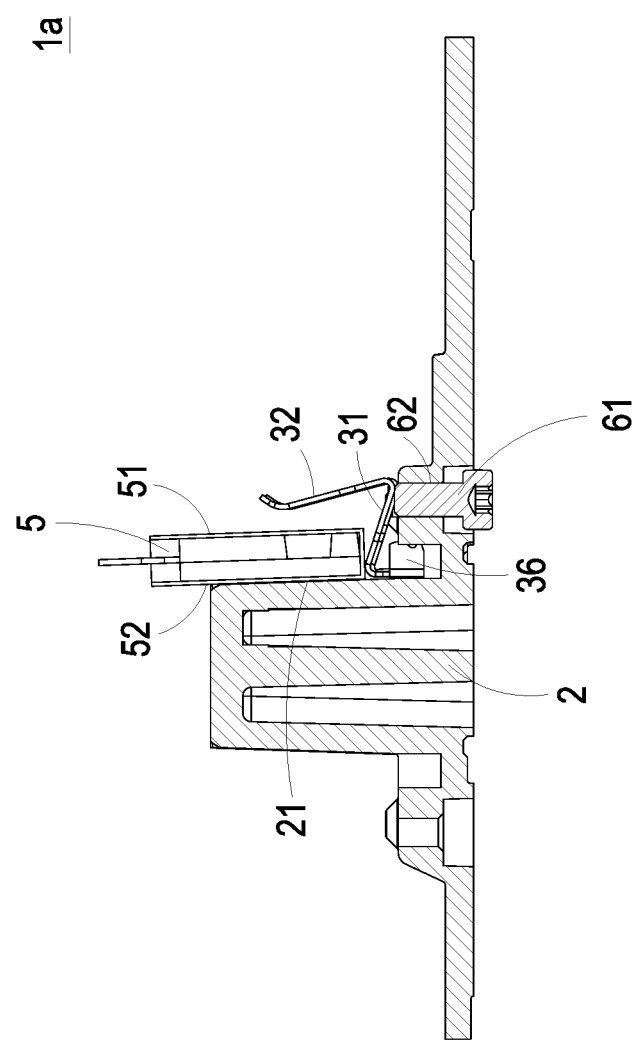
FIG. 16 is a lateral view of FIG. 15.
Figure 17:
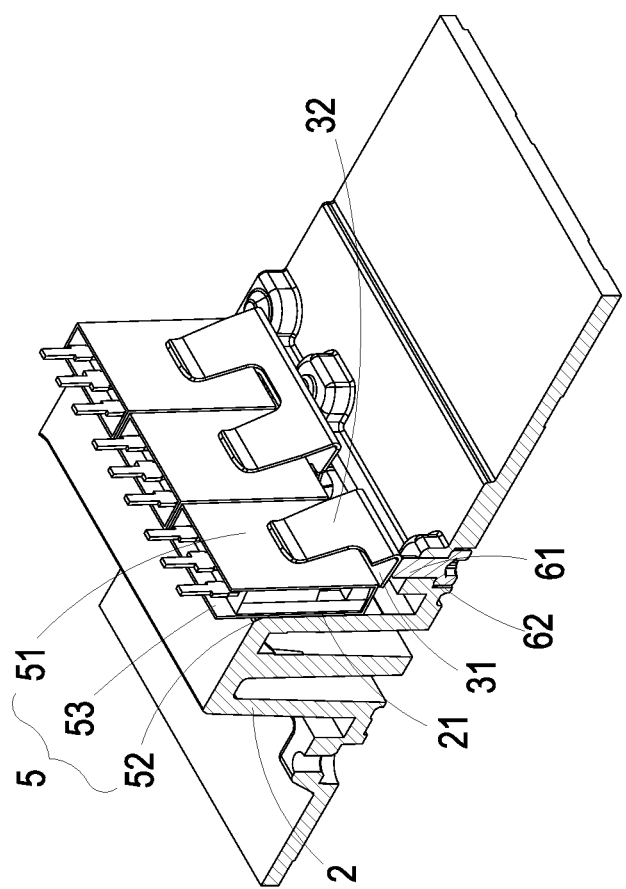
FIG. 17 is a schematic view illustrating the power device clamped by the resilient bracket according to the second embodiment of the present disclosure.
Figure 18:
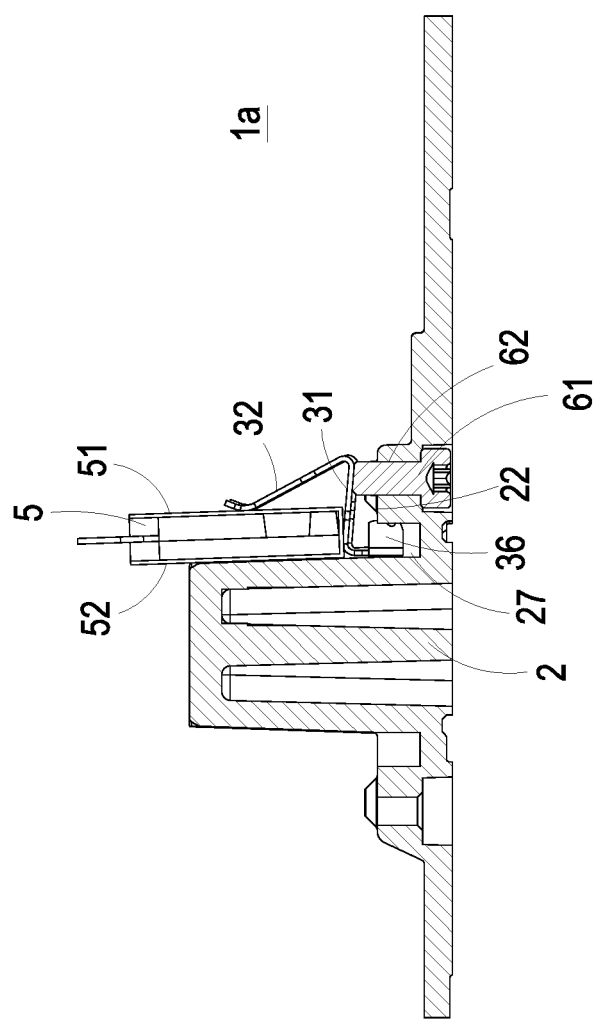
FIG. 18 is a lateral view of FIG. 17.

FIG. 12 is an exploded view illustrating a part of the power module assembly according to a second embodiment of the present disclosure, FIG. 13 is a schematic view illustrating the resilient bracket according to the second embodiment of the present disclosure, FIG. 14 is a schematic view illustrating the resilient bracket pre-fastened on the housing according to the second embodiment of the present disclosure, FIG. 15 is a schematic view illustrating the power device accommodated in the accommodating space according to the second embodiment of the present disclosure, and FIG. 16 is a lateral view of FIG. 15. As shown in FIGS. 12 to 16, in the embodiment, the interposing section 36 of the resilient bracket 3a is extended downwardly from an end of the base section 31 having another end connected with the pushing section 32 and accommodated in the accommodating groove 27 of the housing 2. The base 31 and the installation surface 22 of the housing 2 are at a second predetermined angle. The power device 5 can be accommodated in the accommodating space 7. FIG. 17 is a schematic view illustrating the power device clamped by the resilient bracket according to the second embodiment of the present disclosure, and FIG. 18 is a lateral view of FIG. 17. As shown in FIGS. 17 and 18, the locking part 62 is embedded in the installation surface 22 of the housing 2. While the engaging part 61 is locked into the locking part 62 to press and fasten the base section 31 on the installation surface 22 of the housing 2, the base section 31 drives the pushing section 32 to push against the first side 51 of the power device 5, and thus the second side 52 of the power device 5 and the first heat-dissipation surface 21 of the housing 2 are attached to each other, so that the power device 5 is clamped between the first heat-dissipation 21 of the housing 2 and the pushing section 32.

Similarly, according to the power module assembly 1a, the present disclosure also provides an assembling method of the power module assembly 1a. As shown in FIGS. 9 and 12 to 18, the assembling method is described as following. Firstly, a housing 2 and at least one resilient bracket 3a are provided as shown at the step S1 of FIG. 9. The housing 2 includes at least one first heat-dissipation surface 21 and an installation surface 22. The resilient bracket 3a is pre-fastened on the installation surface 22 of the housing 2, located nearby the first heat-dissipation surface 21, the resilient bracket 3a and the first heat-dissipation surface 21 are configured to form an accommodating space 7 (see FIG. 14). In the embodiment, the interposing section 36 of the resilient bracket 3a is extended downwardly from an end of the base section 31 having another end connected with the pushing section 32 and accommodated in the accommodating groove 27 of the housing 2. A second predetermined angle is formed between the base section 31 and the installation surface 22 of the housing 2. Meanwhile, the power device 5 is not yet pushed by the pushing section 32 of the resilient bracket 3a. On the other hand, a circuit board 4 and at least one power device 5 are provided for the power module assembly 1a as shown at the step S2 of FIG. 9. The power device 5 is inserted into the circuit board 4 (see FIGS. 1 and 2.) Furthermore, the power device 5 is soldered on the first surface 41 of the circuit board 4 by for example but not limited to a soldering method. Then, as shown at the step S3 of FIG. 9, the circuit board 4 is assembled on the housing 2 and the power device 5 is accommodated in the accommodating space 7 (see FIGS. 15 and 16.) Finally, as shown at the step S4 of FIG. 9, the locking part 62 is provided and the engaging part 61 is locked into the locking part 62 to fasten and press the base section 31 on the installation surface 22 of the housing 2. Thus, the base section 31 drives the pushing section 32 to push against the first side 51 of the power device 5, the second side 52 of the power device 5 is attached to the first heat-dissipation surface 21 of the housing 2, so that the power device 5 is clamped between the first heat-dissipation 21 of the housing 2 and the pushing section 32.

It is noted that the resilient bracket 3 are pre-fastened on the installation surface 22 of the housing 2 by the fastening unit 6, so that the pushing section 32 of the resilient bracket 3 or 3a and the first heat-dissipation surface 21 of the housing 2 are configured to form the accommodating space 7. While the power device 5 inserted in the circuit board 4 is accommodated in the accommodating space 7. When the engaging part 61 is locked into the locking part 62, the engaging part 61 presses the base section 31 of the resilient bracket 3 to drive the pushing section 32 to push against the first side 51 of the power device 5, the second side 52 of the power device 5 is attached to the first heat-dissipation surface 21 of the housing 2, so that the power device 5 is clamped between the first heat-dissipation surface 21 of the housing 2 and the pushing section 32 and the power device 5 is fastened on the housing 2. It can achieve the purposes of simplifying the assembling process, saving labor, reducing the production cost and improving the reliability of the assembly structure. Since the base section 31 and the pushing section 32 of the resilient bracket 3 or 3a are connected to each other and form a specific angle, the operation direction of locking the engaging part 61 into the locking part 62 to press the base section 31 and the pushing direction of the pushing section 32 to push against the power device 5 are different. It is possible to prevent the designed structure from occupying too much space in a single plane so as to reduce the occupied space of the power device 5 in the power module assembly 1 and 1a and reduce the overall size of the power module assembly 1 and 1a and improve the entire power density. On the other hand, not only the second side 52 of the power device 5 is attached to the first heat-dissipation surface 21 of the housing 2, but also the other heat-generating components such as SMT power device 43 are also soldered on the circuit board 4 and attached to the second heat-dissipation surface 24 directly or through the circuit board 4, so as to exchange heat with the heat-dissipation unit 25 of the housing 2. Consequently, the heat generated by the power device 5 and the SMT power device 43 can be dissipated effectively through the first heat-dissipation surface 21 and the second heat-dissipation surface 24. It can achieve the purpose of reducing the size of heat-dissipation device and improving the power density of the assembly structure. Certainly, the first heat-dissipation surface 21 and the second heat-dissipation surface 24 of the housing 2 are adjustable according to the disposed positions and the numbers of the power device 5 and the SMT power device 43 of the circuit board 4. It is noted that the numbers and disposed positions of the power device 5, the resilient bracket 3 and 3a, the first heat-dissipation surface, the fastening unit 6, the SMT power device 43 and the second heat-dissipation surface 24 of the power module assembly 1 and 1a are not limited and can be adjustable according to the practical requirements. The details are not redundantly described herein.

Figure 19:
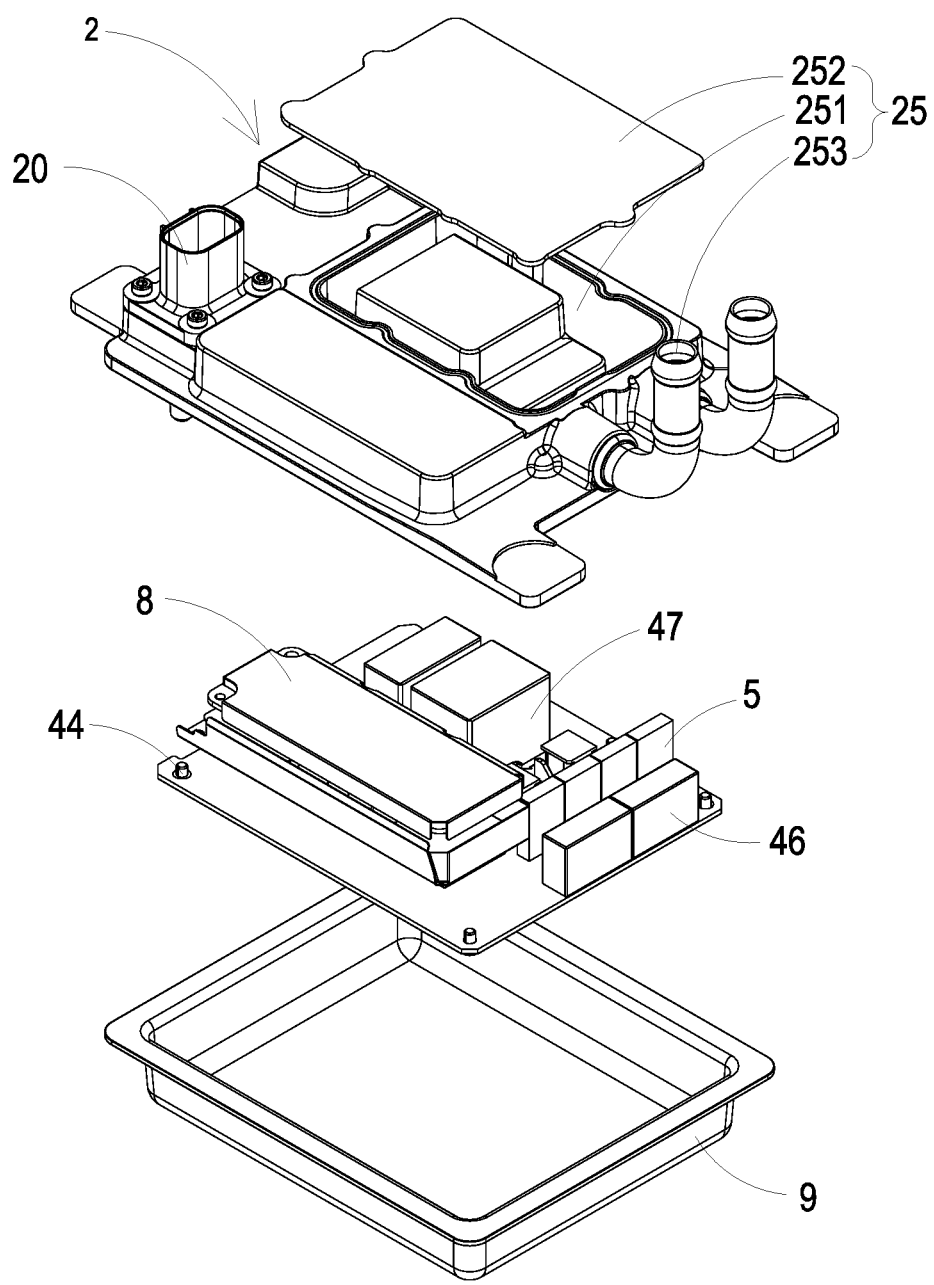
FIG. 19 is an exploded view illustrating the power module according to a third embodiment of the present disclosure.
Figure 20:
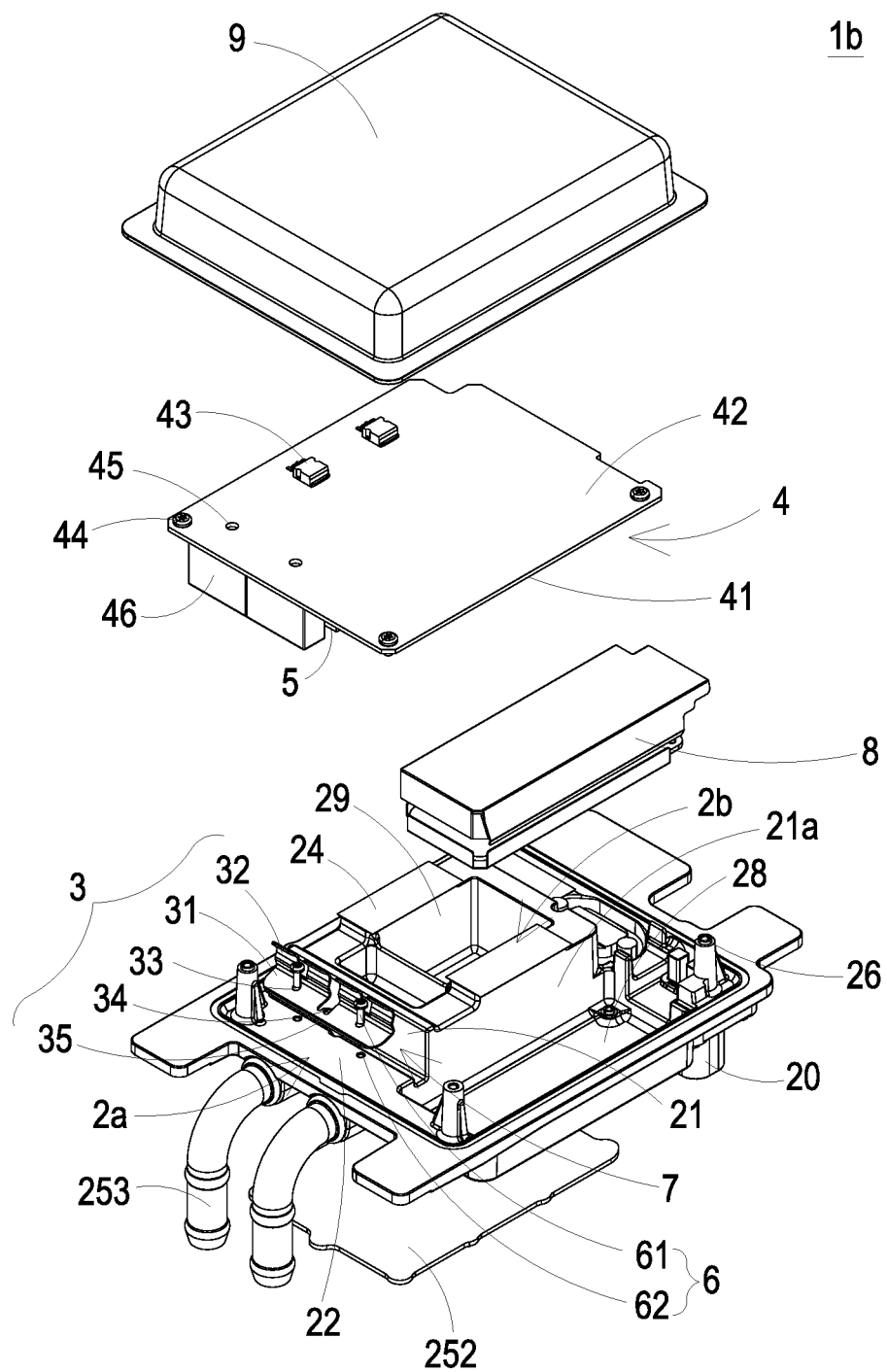
FIG. 20 is another explode view illustrating the power module according to the third embodiment of the present disclosure.
Figure 21:
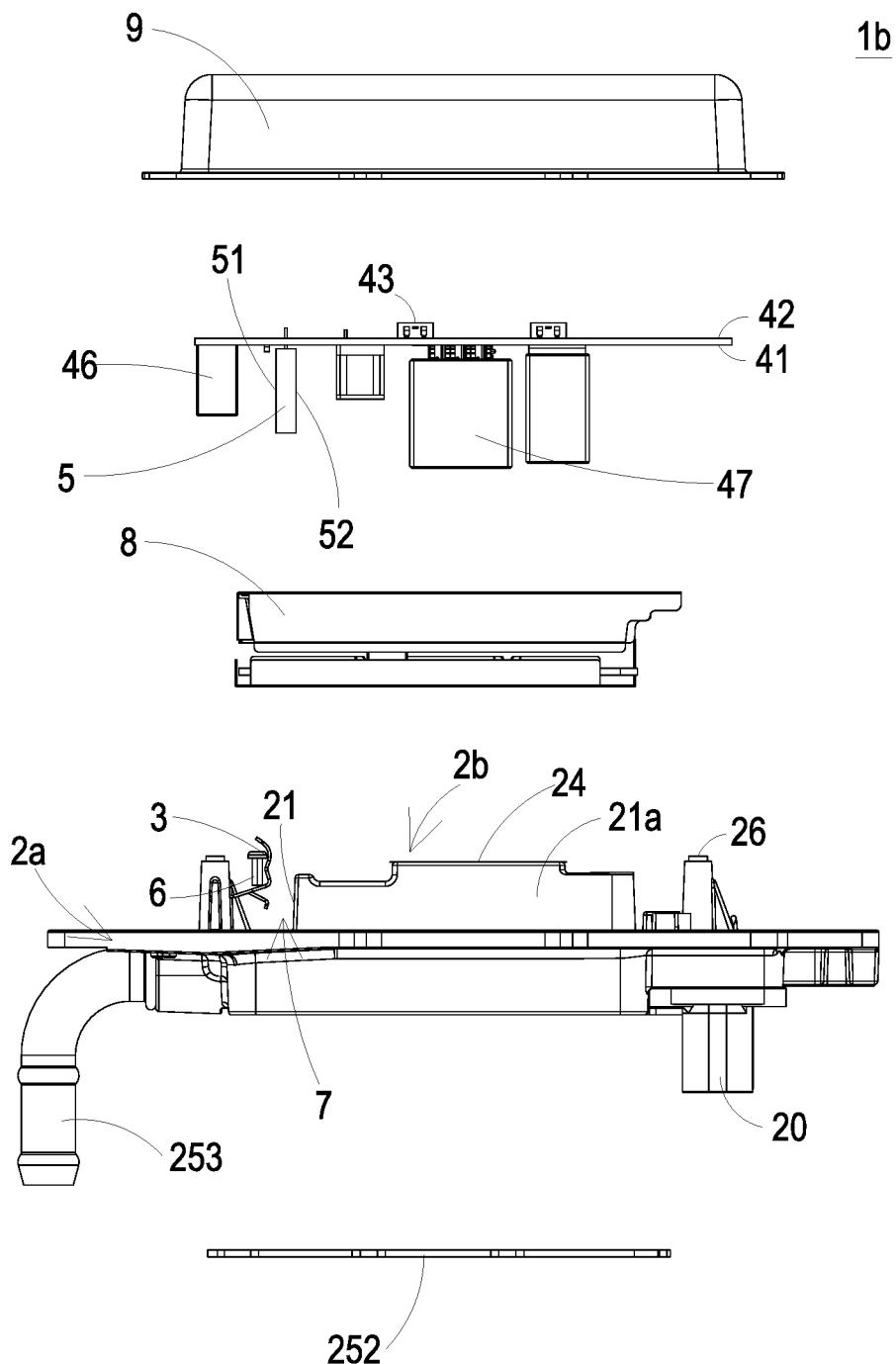
FIG. 21 is a lateral view of FIG. 19.

FIGS. 19 to 21 illustrate a power module according to a third embodiment of the present disclosure. FIG. 19 is an exploded view illustrating the power module according to the third embodiment of the present disclosure, FIG. 20 is another explode view illustrating the power module according to the third embodiment of the present disclosure, and FIG. 21 is a lateral view of FIG. 19. In the embodiment, the structures, elements and functions of the power module 1b are similar to those of the power module assembly 1 in FIGS. 1 to 8 and the power module assembly 1a in FIGS. 11 to 18, and are not redundantly described herein. Different from the power module assembly 1 of FIGS. 1 to 8 and the power module assembly 1a in FIGS. 11 to 18, in the embodiment, the housing 2 of the power module 1b further includes a base 2a and a three-dimensional structure 2b. The base 2a includes at least one installation surface 22. The three-dimensional structure 2b is disposed on the base 2a. The three-dimensional structure 2b includes a first recess 29 and four lateral walls 21a. The first recess 29 is surrounded by the fourth lateral walls 21a. At least one of the lateral walls 21a includes an outer surface configured as the first heat-dissipation surface 21. At least one of the lateral walls 21a includes a top surface configured the second heat-dissipation surface 24. The corresponding lateral wall 21a of the first heat-dissipation surface 21 includes a bottom connected with the installation surface 22. Moreover, in the embodiment, the power module 1b further includes a magnetic component, for example a transformer 47, disposed between the first surface 41 of the circuit board 4 and the housing 2 and electrically connected to the power device 5 and the second power device 43. The power device 5 and the second power device 43 are a secondary power device and a primary power device, respectively. Moreover, the power module 1b further includes an electromagnetic filter (EMI filter) unit 8 disposed between the first surface 41 of the circuit board 4 and the housing 2 and electrically connected to the circuit board 4. On the other hand, the three-dimensional structure 2b of the housing 2 not only includes the first heat-dissipation surface 21 and the second heat-dissipation surface 24, but also includes a first recess 29 adapted for accommodating the transformer 47 on the circuit board 4. The housing 2 further includes a second recess 28 and the electromagnetic filter unit 8 is accommodated in the second recess 28 and electrically connected to the circuit board 4. The second recess 28 is inwardly recessed from the surface of the base 2a along the same recessed direction as that of the first recess 29. The lateral wall of the second recess 28 is shared with one of lateral walls 21a of the three-dimensional structure 2b. While the first surface 41 of the circuit board 4 is attached to the housing 2, the electromagnetic filter unit 8 and the transformer 47 on the circuit board 4 are accommodated in the second recess 28 and the first recess 29 of the housing 2, respectively. Thus, it facilitates the heat-dissipation unit 25 of the housing 2 to dissipate heat generated from the power device 5, the second power device 43, the transformer 47 and the electromagnetic filter unit 8 effectively. Namely, heat is dissipated through the lateral wall 21a and the bottom of first recess 29 of the three-dimensional structure 2b, so that the heat-dissipation efficiency of the power module 1b is improved. In an embodiment, the transformer 47 and the electromagnetic filter unit 8 are further sealed in the first recess 29 and the second recess 28 of the housing 2, respectively by, for example but not limited to, a thermal conductive potting compound (not shown), so as to further improve the heat-dissipation efficiency of the heat-dissipation unit 25 dissipating the heat generated by the transformer 47 and the electromagnetic filter unit 8. In the embodiment, the heat-dissipation unit 25 are further constructed by a top cover 252, a liquid-cooling chamber 251 and a fluid channel 253. The fluid channel 253 is connected with the liquid-cooling chamber 251. The top cover 252 is fastened on the housing 2 by for example but not limited to screws and configured with the housing 2. The top cover 252 and the housing 2 form the liquid-cooling chamber 251. The liquid-cooling chamber 251 is further thermal coupled with the three-dimensional structure 2b so as to enhance the entire heat-dissipation efficiency of the power module 1b. On the other hand, while enhancing the heat-dissipation efficiency, the power module 1b can be packaged to achieve the high power density. In the embodiment, the power device 5 and the second power device 43 are a secondary power device and a primary power device, respectively, and electrically connected the transformer 47. Moreover, the power device 5 and the second power device 43 are attached to the first heat-dissipation surface 21 and the second heat-dissipation surface 24, respectively, and the transformer 47 is accommodated in the first recess 29. The first heat-dissipation surface 21 and the second heat-dissipation surface 24 are located at the outer surface and the top surface of at least one lateral wall 21a so as to obtain a better power density. In the embodiment, the second heat-dissipation surface 24 and the first heat-dissipation surface 21 are not in the same lateral wall 21a. In another embodiment, the second heat-dissipation surface 24 can be the top surfaces of two lateral walls 21a, wherein the two lateral walls 21a are opposite to each other. In the embodiment, the second heat-dissipation surface 24 is the top surface of the lateral wall 21a which is between the first recess 29 and the second recess 28, so as to obtain the better power density. Certainly, in the forgoing embodiments, the layout of the power device 5, the second power device 43, transformer 47 and the electromagnetic filter unit 8 can be adjustable according to the practical requirements. The present disclosure is not limited thereto, and not redundantly described herein.

In the embodiment, the resilient bracket 3 is pre-fastened on the installation surface 22, located nearby the first heat-dissipation surface 21, the resilient bracket 3 and the first heat-dissipation surface 21 are configured to form the accommodating space 7. The resilient bracket 3 is pre-fastened on the installation surface 22 of the housing 2 by pre-fastening the engaging part 61 into the locking part 62 through the through hole 33, the base section 31 the installation surface 22 form the first predetermined angle, and the elastic force of the resilient bracket 3 is maintained. It is noted that the fastening unit 6 pre-fastening the resilient bracket 3 on the installation surface 22 through the through hole 33 can be further adjusted. Namely, the engaging part 61 is locked into the locking part 62, and the engaging part 61 presses the base section 31 of the resilient bracket 3, so as to fasten the base section 31 on the installation surface 22. Consequently, the base section 31 drives the pushing section 32 to push against the power device 5. Accordingly, while the related components of the electromagnetic filter unit 8, the transformer 47 and the circuit board 4 have been fastened on the housing 2, the engaging part 61 is capable of being adjusted to be locked into the locking part 62 through the opening 45, and the engaging part 61 presses the base section 31 of the resilient bracket 3, and then the base section 31 is fastened and push against the installation surface 22. Thus, the base section 31 of the resilient bracket 3 drives the pushing section 32 to push against the first side 51 of the power device 5, the second side 52 of the power device 5 is attached to the first heat-dissipation surface 21, so that the power device 5 is clamped between the first heat-dissipation surface 21 and the pushing section 32 of the resilient bracket 3. In particular, the resilient bracket 3 and the fastening unit 6 for clamping the power device 5 between the first heat-dissipation surface 21 and the pushing section 32 of the resilient bracket 3 does not affect the assembly of the electromagnetic filter unit 8, the transformer 47 and the circuit board 4.

Figure 22:
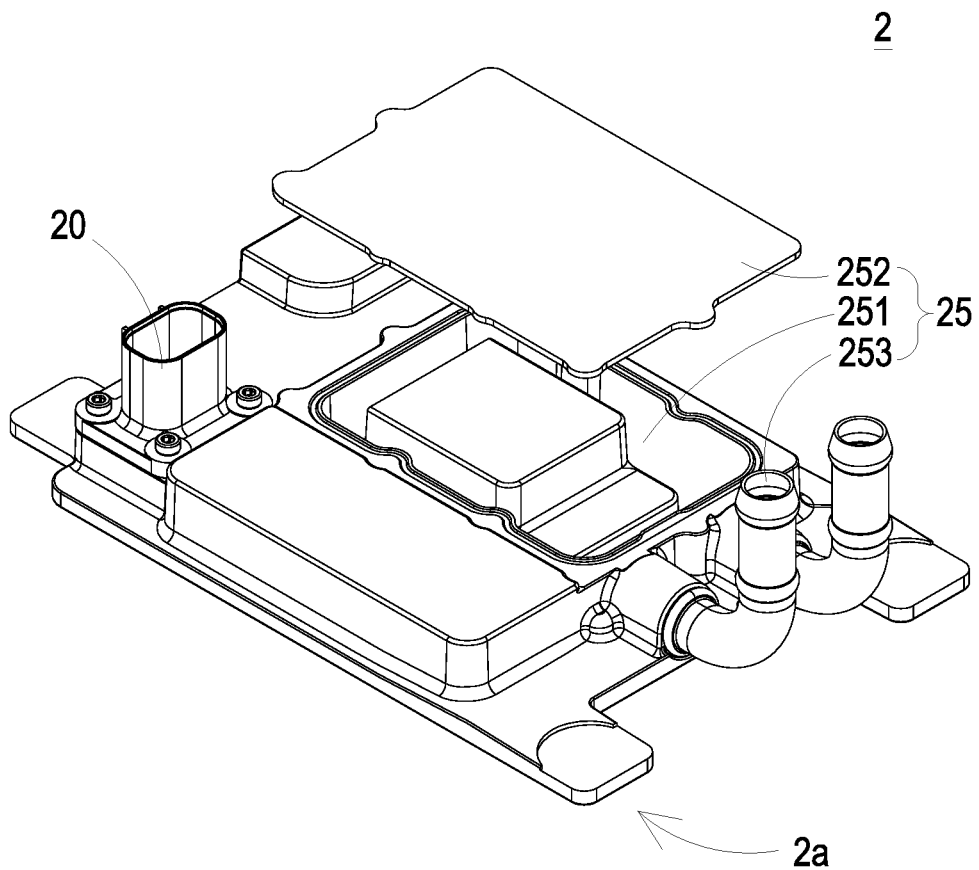
FIG. 22 is a schematic view illustrating the power module in a first assembling stage according to the third embodiment of the present disclosure.
Figure 23:
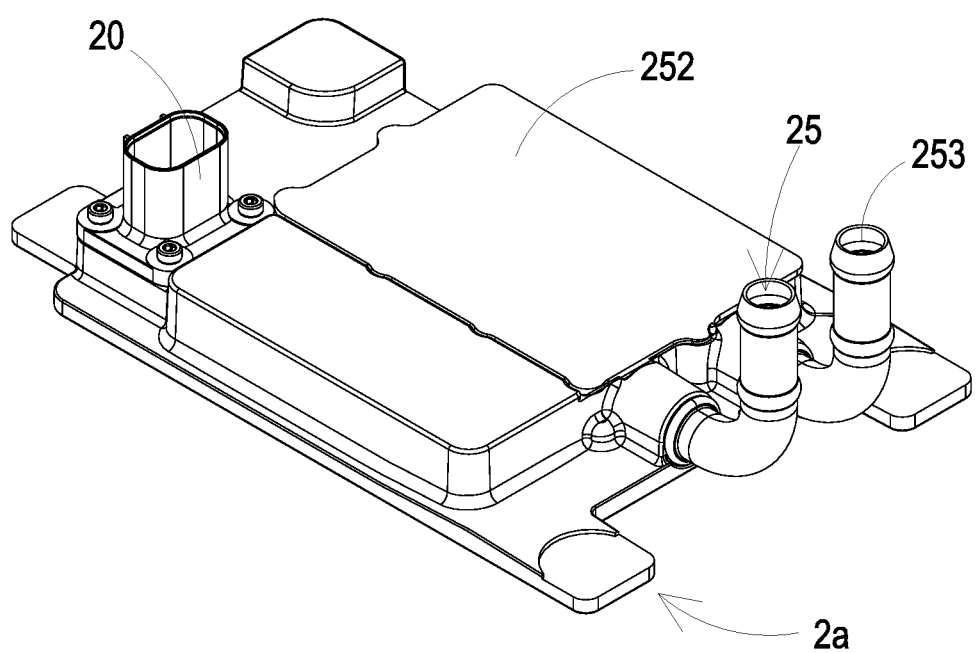
FIG. 23 is a schematic view illustrating the power module in a second assembling stage according to the third embodiment of the present disclosure.
Figure 24:
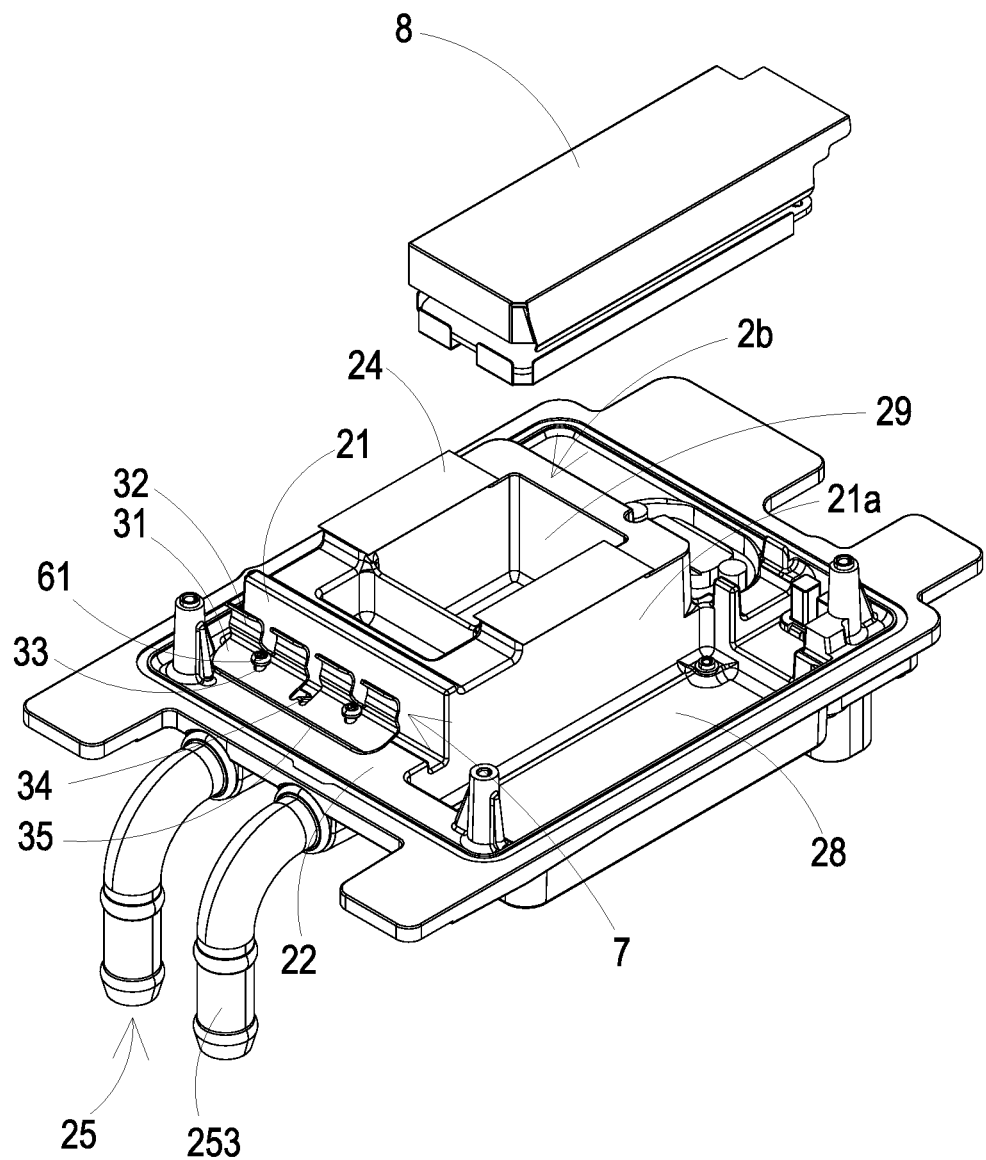
FIG. 24 is a schematic view illustrating the power module in a third assembling stage according to the third embodiment of the present disclosure.
Figure 25:
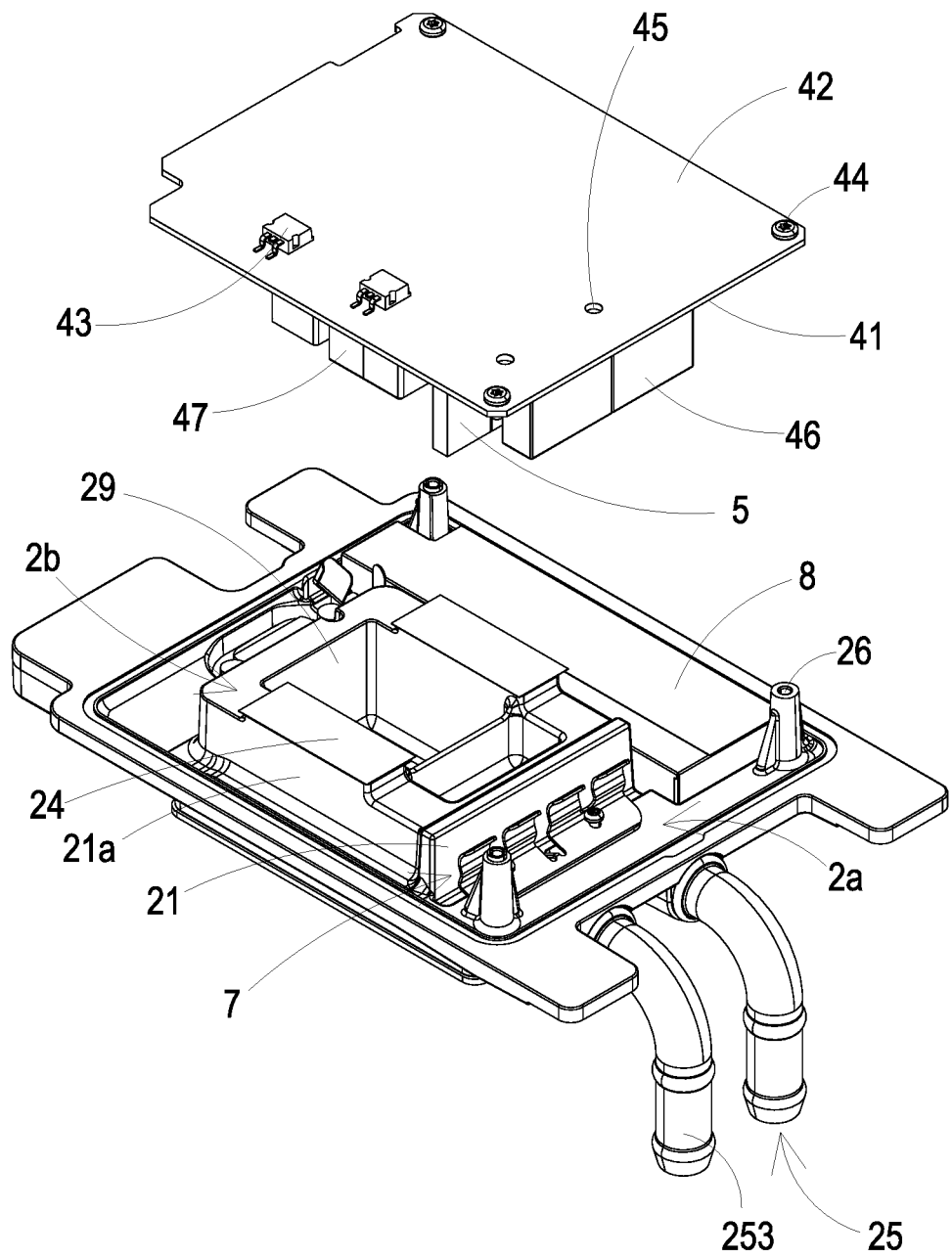
FIG. 25 is a schematic view illustrating the power module in a fourth assembling stage according to the third embodiment of the present disclosure.
Figure 26:
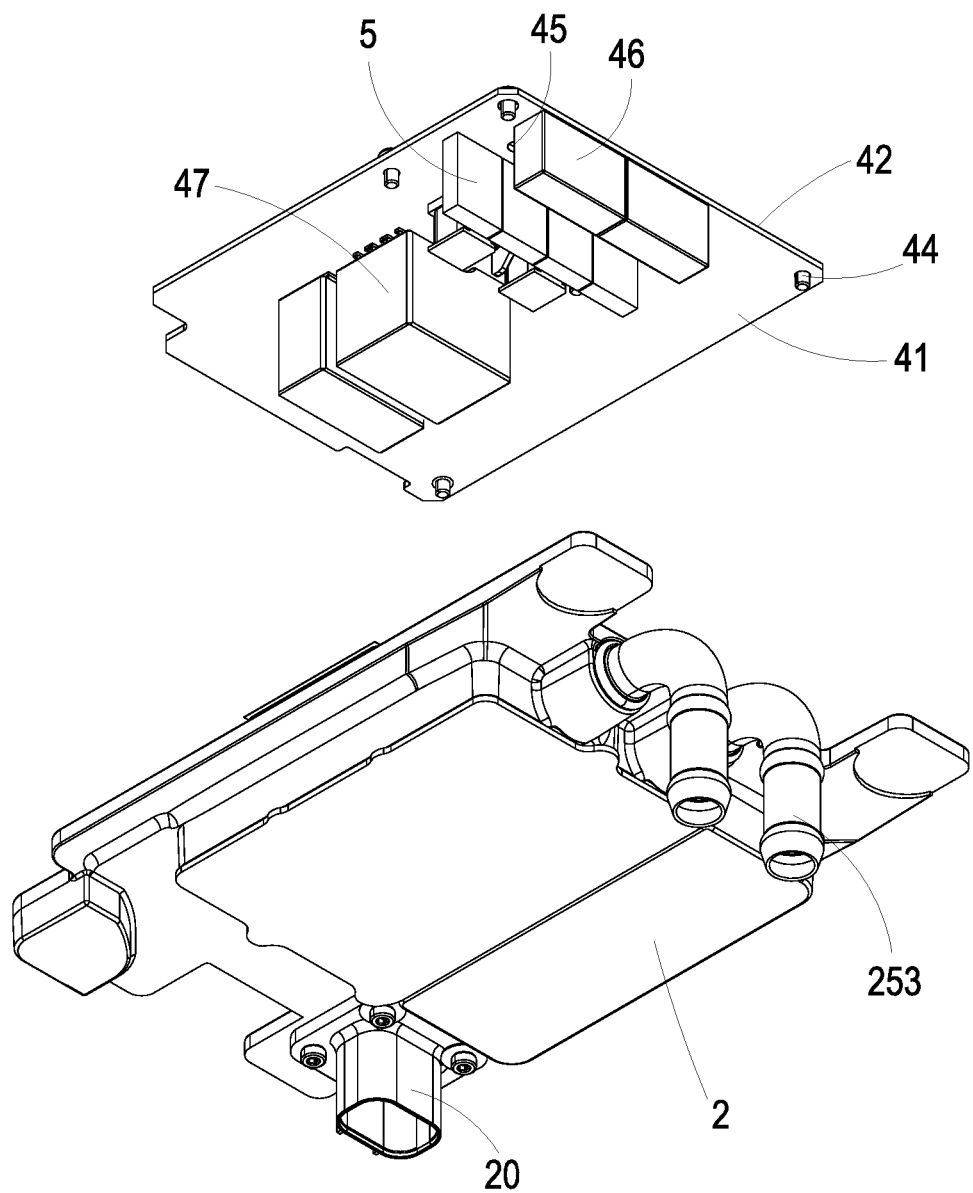
FIG. 26 is another schematic view illustrating the power module in the fourth assembling stage according to the third embodiment of the present disclosure.
Figure 27:
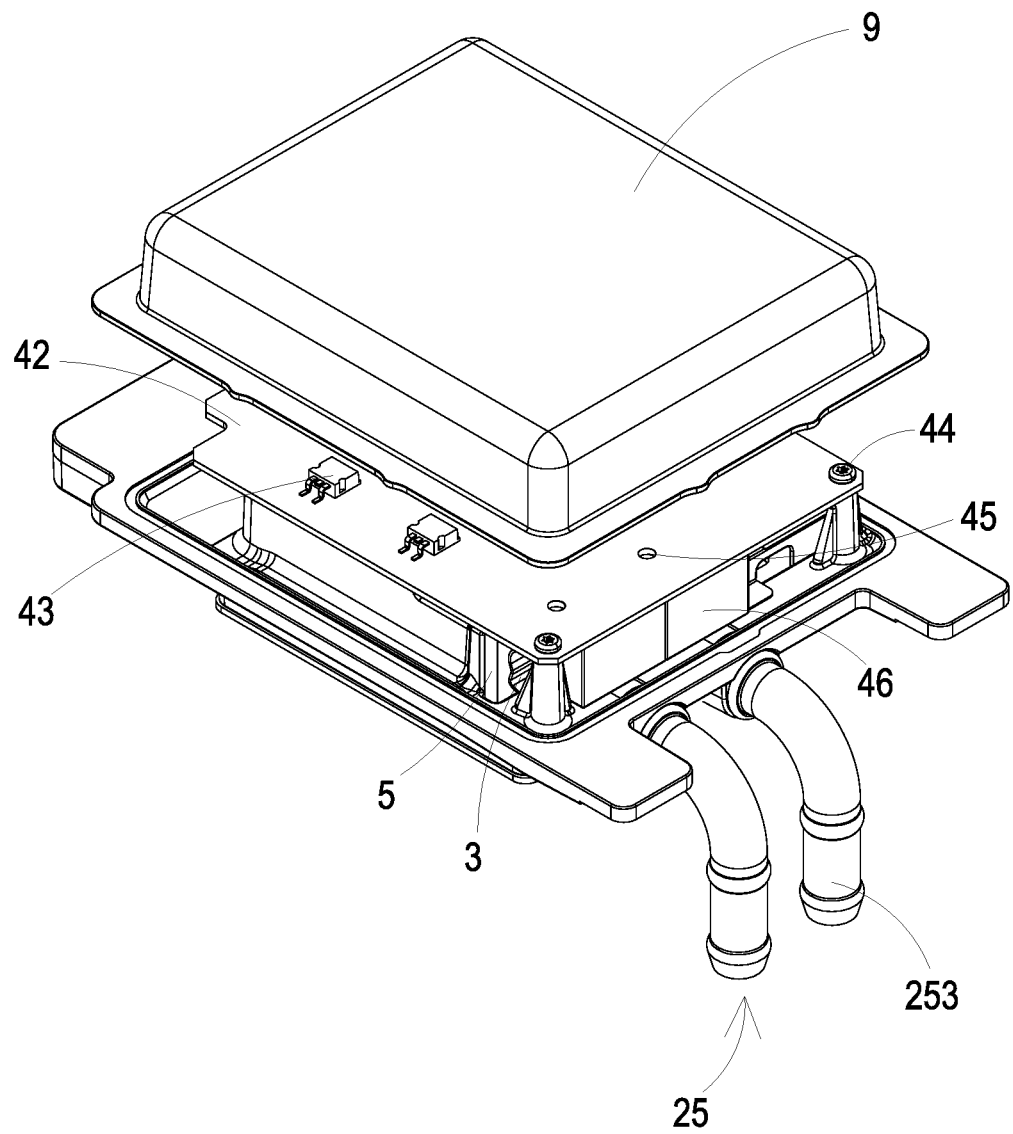
FIG. 27 is a schematic view illustrating the power module in the fifth assembling stage according to the third embodiment of the present disclosure.
Figure 28:
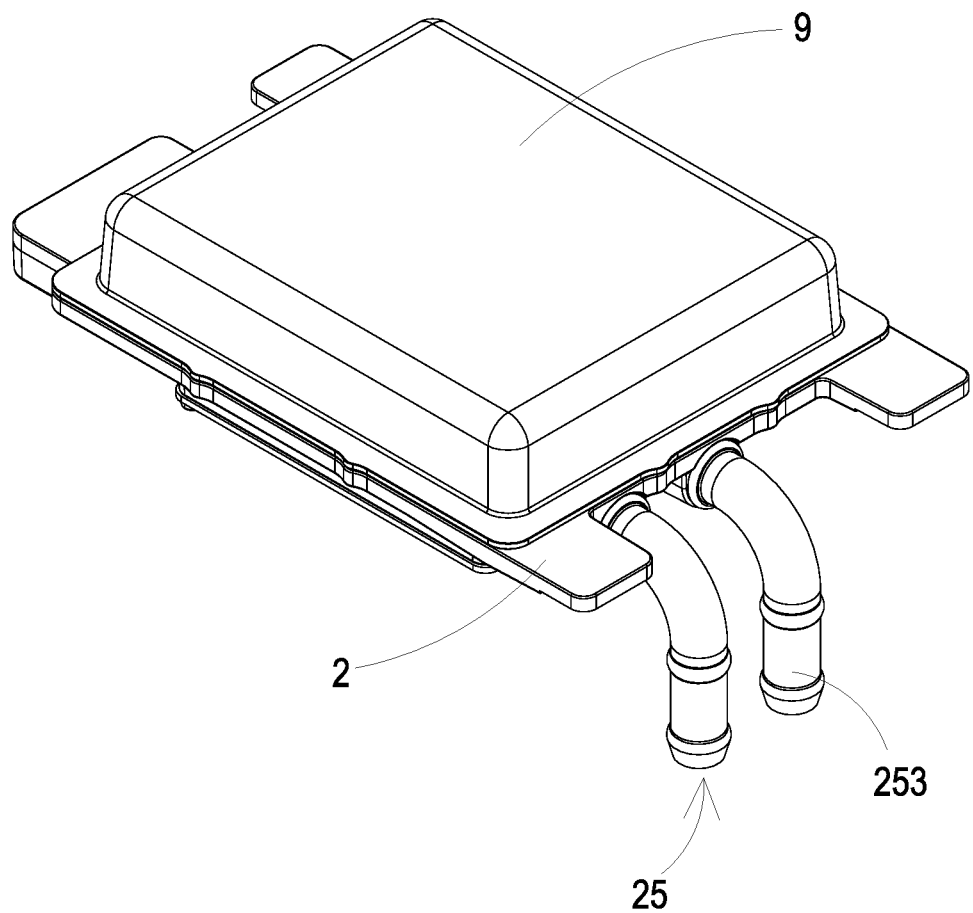
FIG. 28 is a schematic view illustrating the power module in a sixth assembling stage according to the third embodiment of the present disclosure.

FIGS. 22 to 28 are schematic views illustrating the power module in different assembling stages according to the third embodiment of the present disclosure. Firstly, a housing 2 is provided. The housing 2 includes a base 2a and a three-dimensional structure 2b. The base 2a includes at least one installation surface 22. The three-dimensional structure 2b is disposed on the base 2a. The three-dimensional structure 2b includes a first recess 29 and four lateral walls 21a. At least one of the lateral walls 21a includes an outer surface configured as the first heat-dissipation surface 21. At least one of the lateral walls 21a includes a top surface configured the second heat-dissipation surface 24. In the embodiment, the bottom of the first heat-dissipation surface 21 is connected with the installation surface 22. As shown in FIG. 22, in the embodiment, the housing 2 can include for example but not limited to a liquid-cooling heat-dissipation unit 25. The heat-dissipation unit 25 further includes a top cover 252, a liquid-cooling chamber 251 and a fluid channel 253. The fluid channel 253 is connected with the liquid-cooling chamber 251. The top cover 252 is fastened on the housing 2 by for example but not limited to screws. The top cover 252 and the housing 2 form the liquid-cooling chamber 251. Certainly, the heat-dissipation unit 25 thermally coupled to the three-dimensional structure 2b is not limited to the exemplary liquid-cooling form, and not redundantly described herein. In some embodiments, the power module 1b further includes at least one plug-in component 20 disposed on the housing 2 directly, as shown in FIG. 23. The plug-in component 20 is used as a power transmission terminal or a signal transmission terminal. The position of the through-hole component 20 does not affect the function of the heat-dissipation unit 25 in the housing 2, and not redundantly described herein. Similarly, the resilient bracket 3 and the fastening unit 6 are pre-fastened on the installation surface 22, as shown in FIG. 24. It is noted that, in the embodiment, the power module 1b not only includes the first heat-dissipation surface 21 and the second heat-dissipation surface 24, but also includes the second recess 28 and the first recess 29 adapted for accommodating other electronic components with the heat-dissipation requirement. In the embodiment, the second recess 28 and the first recess 29 are used for accommodating the electromagnetic filter unit 8 and the transformer 47 on the circuit board 4, respectively. It has to be emphasized that the layout of the first heat-dissipation surface 21, the second heat-dissipation surface 24, the second recess 28 and the first recess 29 are adjustable according to the practical requirement. The present disclosure is not limited thereto and not redundantly described herein. In the embodiment, as shown in FIG. 25, the electromagnetic filter unit 8 and the transformer 47 can be pre-fastened in the second recess 28 and the first recess 29 by a thermal conductive potting compound sealed, so as to further improve the heat-dissipation efficiency of the heat-dissipation unit 25 dissipating the heat generated by the transformer 47 and the electromagnetic filter unit 8. In the embodiment, the circuit board 4 is fastened on the fixing hole 26 of the housing 2 through the fixing element 44. Namely, the circuit board 4 is assembled on the housing 2. FIGS. 25 and 26 further illustrates the relative combination of the circuit board and the housing. It is noted that the circuit board 4 not only includes the power device 5 and the second power device 43, but also includes the transformer 47. The power device 5 and the second power device 43 are a secondary power device and a primary power device and further electrically connected to the secondary coil and the primary coil of the transformer 43, respectively. They are configured with other components (not shown) to construct a high voltage DC transformer unit. While the circuit board 4 is assembled on the housing 2, the power device 5 is accommodated in the accommodating space 7 configured by the pushing section 32 of the resilient bracket 3 and the first heat-dissipation surface 21. Moreover, the second power device 43 is attached to the second heat-dissipation surface 24 through the circuit board 4, so as to execute the heat exchange with the heat-dissipation unit 25. The electromagnetic filter unit 8 and the transformer 47 are accommodated in the second recess 28 and the first recess 29, respectively, so as to facilitate the heat-dissipation unit 25 to dissipate the heat. Then, the engaging part 61 is adjusted to be locked into the locking part 62 through the opening 45. The engaging part 61 pushes against the base section 31 of the resilient bracket 3 and the base section 31 is fastened to push against installation surface 22. Thus, the base section 31 of the resilient bracket 3 drives the pushing section 32 to push against the first side 51 of the power device 5, the second side 52 of the power device 5 is attached to the first heat-dissipation surface 21, and the power device 5 is clamped between the first heat-dissipation surface 21 and the pushing section 32 of the resilient bracket 3. After assembling according to the above descriptions, the power module 1b with high heat-dissipation efficiency can be obtained, as shown in FIG. 26. In the embodiment, the power module 1b further includes an outer cover 9 mounted on the housing 2 by for example but not limited to screws, and further covering the assembled circuit board 4. It is noted that, in the embodiment, the power device 5 and the second power device 43 are the secondary device and the primary power device of the power module 1b, and constructed with the transformer 47 on the circuit board 4 to form for example but not limited to a high voltage DC power module. Moreover, the power module 1b further includes an electromagnetic filter unit 8 disposed between the circuit board 4 and the housing and electrically connected to the circuit board 4, so as to be adapted for a part of the circuit of the high voltage DC power module and provide the function of filtering. Meanwhile, in the power module 1b of the embodiment, the power device 5, the second power device 43, the transformer 47 and the electromagnetic filter unit 8 all generate a large amount of heat. As the forgoing described power module 1b, it facilitates the heat-dissipation unit 25 to dissipate heat generated from the power device 5, the second power device 43, the transformer 47 and the electromagnetic filter unit 8 effectively through the three-dimensional structure 2b. It has to be emphasized that the layout of the power device 5, the second power device 43, the transformer 47 and the electromagnetic filter unit 8 can be adjustable according to the practical requirements. The present disclosure is not limited thereto, and not redundantly described herein.

In summary, the present disclosure provides a power module, a power module assembly and an assembling method thereof. By optimizing the assembling structure of the power devices, the power devices are fastened easily and firmly, the heat-dissipating capacity of the power devices is increased simultaneously, and the entire size of the power module assembly is reduced so that the power density of the power module assembly is enhanced. In addition, by pre-fastening a fastening structure of the power devices on a housing, the disposing and fastening procedures are simplified and thus the purposes of saving the labor, reducing the production cost and improving the reliability of the assembly structure are achieved. Moreover, the pre-fastened fastening structure can be adjusted at different angles to push against the power device, it is advantage of reducing the size of the heat-dissipation device in the overall assembly and enhancing the heat dissipation effect. Furthermore, the occupied space of the power device in the overall assembly is reduced to reduce the entire size of the assembling structure and achieve the purpose of enhancing the overall power density.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module assembly comprising:
   a housing including at least one first heat-dissipation surface and an installation surface directly connected to each other, wherein the housing further comprises a positioning recess disposed in the installation surface of the housing and located nearby the first heat-dissipation surface;
   at least one resilient bracket pre-fastened on the installation surface of the housing, located near the first heat-dissipation surface and configured with the first heat-dissipation surface to form an accommodating space, wherein the resilient bracket comprises a base section, a pushing section and a positioning and supporting section, the base section includes at least one through hole, the pushing section is connected with the base section, and the positioning and supporting section extended outwardly from the base section and away from the pushing section, wherein an engaging part is inserted into a locking part through the through hole, the base section of the resilient bracket is pre-fastened on the installation surface of the housing, a part of the positioning and supporting section is accommodated in the positioning recess, the positioning and supporting section sustains the base section, so that a first predetermined angle is formed between the base section and the installation surface of the housing, wherein while the engaging part is locked into the locking part to fasten and press the base section on the installation surface of the housing, the positioning recess and the positioning and supporting section are matched with each other to guide the base section to move close to the installation surface of the housing; a circuit board configured to assemble on the housing; at least one power device plugged in the circuit board and accommodated in the accommodating space; and at least one fastening unit including the engaging part and the locking part, wherein the locking part is disposed in the installation surface of the housing, wherein while the engaging part is inserted and locked into the locking part, the engaging part of the fastening unit moves relative to the installation surface and presses the resilient bracket and the resilient bracket pushes against the power device, so that the power device is attached to the first heat-dissipation surface and clamped between the resilient bracket and the first heat-dissipation surface.

2. The power module assembly according to claim 1, wherein while the engaging part is locked into the locking part to fasten and press the base section on the installation surface of the housing, the base section drives the pushing section to push against a first side of the power device, a second side of the power device is attached to the first heat-dissipation surface, and the power device is clamped between the first heat-dissipation surface and the pushing section of the resilient bracket.

3. The power module assembly according to claim 1, wherein the base section further comprises a curl edge disposed opposite to the pushing section, wherein while the engaging part is inserted into the locking part through the through hole, the base section of the resilient bracket is pre-fastened on the installation surface of the housing, the curl edge of the base section is in contact with the installation surface, wherein while the engaging part is locked into the locking part to fasten and press the base section on the installation surface of the housing, the curl edge of the base section slides along the installation surface of the housing so that the base section is attached to the installation surface of the housing.

4. The power module assembly according to claim 1, wherein the pushing section and the base section of the resilient bracket are connected with each other and constructed to form an L shape.

5. The power module assembly according to claim 1, wherein the circuit board further comprises at least one opening, wherein the opening is located right above the engaging part, and the engaging part is locked in the locking part through the opening.

6. The power module assembly according to claim 1, wherein the resilient bracket comprises an interposing section, the base section is connected between the pushing section and the interposing section, and the housing further comprises at least one accommodating groove disposed in the installation surface of the housing and located nearby the first heat-dissipation surface, wherein the interposing section of the resilient bracket is extended downwardly from an end of the base section having another end connected with the pushing section, wherein while the interposing section is accommodated in the accommodating groove, a second predetermined angle is formed between the base section and the installation surface of the housing, wherein while the engaging part is locked into the locking part to press and fasten the base section on the installation surface of the housing, the base section drives the pushing section to push against a first side of the power device, a second side of the power device is attached on the first heat-dissipation surface, and the power device is clamped between the first heat-dissipation surface and the pushing section of the resilient bracket.

7. The power module assembly according to claim 6, wherein the pushing section, the base section and the interposing section of the resilient bracket are connected together and constructed to form a Z shape.

8. The power module assembly according to claim 1, wherein the engaging part is a screw bolt and the locking part is embedded in the installation surface of the housing.

9. The power module assembly according to claim 1, wherein the housing further comprises a second heat-dissipation surface, wherein while the power device is clamped between the resilient bracket and the first heat-dissipation surface, the second heat-dissipation surface and a first surface of the circuit board are attached to each other.

10. The power module assembly according to claim 9, wherein the circuit board further comprises at least one second power device, and the second power device is soldered on a second surface opposite to the first surface.

11. The power module assembly according to claim 1, wherein the housing further comprises a heat-dissipation unit to exchange heat with the first heat-dissipation surface.

12. The power module assembly according to claim 9, wherein the housing further comprises a heat-dissipation unit to exchange heat with the first heat-dissipation surface and the second heat-dissipation surface.

13. The power module assembly according to claim 1, wherein the power device is a through-hole power device.

14. The power module assembly according to claim 1, wherein the power device is a power transistor.

15. The power module assembly according to claim 1, wherein the power device further includes a sleeve and a main body, and the sleeve covers the main body of the power device.

16. An assembling method of a power module, comprising steps of: (a) providing a housing and at least one resilient bracket, wherein the housing includes at least one first heat-dissipation surface and an installation surface directly connected to each other, and the resilient bracket is pre-fastened on the installation surface of the housing, located nearby the first heat-dissipation surface and configured with the first heat-dissipation surface to form an accommodating space, wherein the housing further comprises a positioning recess disposed in the installation surface of the housing and located nearby the first heat-dissipation surface, wherein the resilient bracket comprises a base section, a pushing section and a positioning and supporting section, the base section includes at least one through hole, the pushing section is connected with the base section, and the positioning and supporting section extended outwardly from the base section and away from the pushing section, wherein the step (a) further comprises a step (a1) inserting an engaging part into a locking part through the through hole to pre-fasten the resilient bracket on the installation surface of the housing, wherein a first predetermined angle is formed between the base section and the installation surface of the housing, wherein the step (a1) further comprises a step (a0) placing a part of the positioning and supporting section in the positioning recess so that the positioning and supporting section sustains the base section; (b) providing a circuit board and at least one power device, wherein the power device is plugged in the circuit board; (c) assembling the circuit board on the housing and accommodating the power device in the accommodating space; and (d) providing at least one fastening unit including the engaging part and the locking part, wherein the locking part is disposed in the installation surface of the housing, wherein while the engaging part is inserted and locked into the locking part, the engaging part of the fastening unit moves relative to the installation surface and presses the resilient bracket and the resilient bracket pushes against the power device, so that the power device is attached to the first heat-dissipation surface and clamped between the resilient bracket and the first heat-dissipation surface.

17. The assembling method of the power module according to claim 16, wherein the step (d) further comprises a step (d1) locking the engaging part into the locking part to press and fasten the base section on the installation surface of the housing, so that the base section drives the pushing section to push against a first side of the power device, a second side of the power device is attached to the first heat-dissipation surface, and the power device is clamped between the first heat-dissipation surface and the pushing section of the resilient bracket.

18. The assembling method of the power module according to claim 17, wherein the circuit board further comprises at least one opening, and the opening is set right above the engaging part, wherein at the step (d1), the engaging part is locked into the locking part through the opening.

19. The assembling method of the power module according to claim 16, wherein the base section further comprises a curl edge disposed opposite to the pushing section, wherein the step (d) further comprises a step (d1) inserting the engaging part into the locking part through the through hole to pre-fasten the base section of the resilient bracket on the installation surface of the housing and allow the curl edge of the base section to be in contact with the installation surface of the housing, and a step (d2) locking the engaging part into the locking part to fasten and press the base section on the installation surface of the housing, wherein the curl edge of the base section slides along the installation surface of the housing, the base section is attached to the installation surface of the housing.

20. The assembling method of the power module according to claim 16, wherein the resilient bracket comprises an interposing section, the base section is connected between the pushing section and the interposing section, and the housing further comprises at least one accommodating groove disposed in the installation surface of the housing and located nearby the first heat-dissipation surface, wherein the interposing section of the resilient bracket is extended downwardly from an end of the base section having another end connected with the pushing section, wherein the step (a) further comprises a step (a2) placing the interposing section into the accommodating groove of the housing, wherein a second predetermined angle is formed between the base section and the installation surface of the housing.

21. The assembling method of the power module according to claim 20, wherein, the step (d) further comprises a step (d2) locking the engaging part into the locking part to press and fasten the base section on the installation surface of the housing, wherein the base section drives the pushing section to push against a first side of the power device, a second side of the power device is attached on the first heat-dissipation surface, and the power device is clamped between the first heat-dissipation surface and the pushing section of the resilient bracket.

22. A power module comprising:
    a housing including a base and a three-dimensional structure, wherein the base comprises at least one installation surface, and the three-dimensional structure which is disposed on the base comprises a first recess and four lateral walls, wherein at least one of the laterals walls includes an outer surface configured as a first heat-dissipation surface and the corresponding lateral wall of the first heat-dissipation surface includes a bottom connected with the installation surface;

at least one resilient bracket pre-fastened on the installation surface, located near the first heat-dissipation surface and configured with the first heat-dissipation surface to form an accommodating space;
a circuit board configured to assemble on the housing;
at least one magnetic component accommodated in the first recess and electrically connected to the circuit board;
at least one power device plugged in the circuit board and accommodated in the accommodating space; and
at least one fastening unit including an engaging part and a locking part, wherein the locking part is disposed in the installation surface, wherein while the engaging part is inserted and locked into the locking part, the fastening unit presses the resilient bracket and the resilient bracket pushes against the power device, so that the power device is attached to the first heat-dissipation surface and clamped between the resilient bracket and the first heat-dissipation surface.

23. The power module according to claim 22, wherein the three-dimensional structure further comprises a second heat-dissipation surface, wherein while the power device is clamped between the resilient bracket and the first heat-dissipation surface, the second heat-dissipation surface and a first surface of the circuit board are attached to each other.

24. The power module according to claim 23, wherein the circuit board further comprises at least one second power device, and the second power device is soldered on a second surface opposite to the first surface.

25. The power module according to claim 23, wherein the second heat-dissipation surface is a top surface of one of the lateral walls.

26. The power module according to claim 22, further comprising an electromagnetic filter unit, wherein the housing further comprises a second recess, and the electromagnetic filter unit is accommodated in the second recess and electrically connected to the circuit board.

27. The power module according to claim 22, wherein the magnetic component comprises a transformer accommodated in the first recess and electrically connected to the circuit board.

28. The power module according to claim 24, wherein the power device and the second power device are a secondary power device and a primary power device, respectively.

29. The power module according to claim 22, wherein the housing further comprises a heat-dissipation unit including a liquid-cooling chamber and a fluid channel, the heat-dissipation unit is thermal coupled with the three-dimensional structure.

30. The power module according to claim 24, wherein the power device and the second power device are power transistors.

31. The power module according to claim 22, wherein the resilient bracket comprises a base section and a pushing section, the base section includes at least one through hole, and the pushing section is connected with the base section, wherein while the engaging part is inserted into the locking part through the through hole and the base section of the resilient bracket is pre-fastened on the installation surface, a first predetermined angle is formed between the base section and the installation surface, wherein while the engaging part is locked into the locking part to fasten and press the base section on the installation surface, the base section drives the pushing section to push against a first side of the power device, a second side of the power device is attached to the first heat-dissipation surface, and the power device is clamped between the first heat-dissipation surface and the pushing section of the resilient bracket.

32. The power module according to claim 31, wherein the housing further comprises a positioning recess disposed in the installation surface and located nearby the first heat-dissipation surface, and the resilient bracket further comprises a positioning and supporting section extended outwardly from the base section and away from the pushing section, wherein while the engaging part is inserted into the locking part through the through hole, the base section of the resilient bracket is pre-fastened on the installation surface, a part of the positioning and supporting section is accommodated in the positioning recess, the positioning and supporting section sustains the base section, and the first predetermined angle is formed between the base section and the installation surface, wherein while the engaging part is locked into the locking part to fasten and press the base section on the installation surface, the positioning recess and the positioning and supporting section are matched with each other to guide the base section to move close to the installation surface.

33. The power module according to claim 31, wherein the base section further comprises a curl edge disposed opposite to the pushing section, wherein while the engaging part is inserted into the locking part through the through hole, the base section of the resilient bracket is pre-fastened on the installation surface, the curl edge of the base section is in contact with the installation surface, wherein while the engaging part is locked into the locking part to fasten and press the base section on the installation surface, the curl edge of the base section slides along the installation surface so that the base section is attached to the installation surface.

34. The power module according to claim 31, wherein the pushing section and the base section of the resilient bracket are connected with each other and constructed to form an L shape.

35. The power module according to claim 22, wherein the circuit board further comprises at least one opening, wherein the opening is set right above the engaging part and the engaging part is locked into the locking part through the opening.

36. The power module according to claim 22, wherein the resilient bracket comprises a base section, a pushing section and an interposing section, the base section is connected between the pushing section and the interposing section, and the base further comprises at least one accommodating groove disposed in the installation surface and located nearby the first heat-dissipation surface, wherein the interposing section of the resilient bracket is extended downwardly from an end of the base section having another end connected with the pushing section, wherein while the interposing section is accommodated in the accommodating groove, a second predetermined angle is formed between the base section and the installation surface, wherein while the engaging part is locked into the locking part to press and fasten the base section on the installation surface, the base section drives the pushing section to push against a first side of the power device, a second side of the power device is attached on the first heat-dissipation surface, so that the power device is clamped between the first heat-dissipation surface and the pushing section of the resilient bracket.

37. The power module according to claim 36, wherein the pushing section, the base section and the interposing section of the resilient bracket are connected together and constructed to form a Z shape.

* * * * *